(12) United States Patent
Fujita et al.

(10) Patent No.: US 8,649,159 B2
(45) Date of Patent: *Feb. 11, 2014

(54) SEMICONDUCTOR MODULE DEVICE AND DRIVING APPARATUS HAVING THE SAME

(75) Inventors: Toshihiro Fujita, Aichi-gun (JP);
Hiroyasu Kidokoro, Kariya (JP);
Hiromasa Hayashi, Obu (JP)

(73) Assignee: Denso Corporation, Kariya (JP)

( * ) Notice: Subject to any disclaimer, the term of this patent is extended or adjusted under 35 U.S.C. 154(b) by 158 days.

This patent is subject to a terminal disclaimer.

(21) Appl. No.: 13/068,194

(22) Filed: May 4, 2011

(65) Prior Publication Data

US 2011/0285336 A1    Nov. 24, 2011

(30) Foreign Application Priority Data

May 21, 2010   (JP) .................................. 2010-117689

(51) Int. Cl.
*H05K 5/02*    (2006.01)
*H05K 7/02*    (2006.01)

(52) U.S. Cl.
USPC ...... 361/622; 361/625; 361/679.01; 361/728; 318/400.27; 310/43; 310/71

(58) Field of Classification Search
USPC ........ 361/622, 625, 679.01, 728; 318/400.27; 363/131; 310/43, 71
See application file for complete search history.

(56) References Cited

U.S. PATENT DOCUMENTS

| | | | |
|---|---|---|---|
| 5,297,001 A * | 3/1994 | Sterling | 361/717 |
| 5,497,289 A * | 3/1996 | Sugishima et al. | 361/709 |
| 5,930,112 A * | 7/1999 | Babinski et al. | 361/695 |
| 6,181,590 B1 | 1/2001 | Yamane et al. | |
| 6,291,880 B1 * | 9/2001 | Ogawa et al. | 257/723 |
| 6,525,950 B1 | 2/2003 | Shirakawa et al. | |
| 6,618,278 B2 * | 9/2003 | Suzuki et al. | 363/144 |
| 6,690,087 B2 * | 2/2004 | Kobayashi et al. | 257/686 |
| 6,914,325 B2 * | 7/2005 | Kobayashi et al. | 257/686 |
| 6,933,593 B2 * | 8/2005 | Fissore et al. | 257/675 |
| 7,046,535 B2 * | 5/2006 | Rodriguez et al. | 363/146 |
| 7,420,224 B2 * | 9/2008 | Milich et al. | 257/177 |
| 7,508,668 B2 * | 3/2009 | Harada et al. | 361/699 |
| 7,545,033 B2 * | 6/2009 | Grant | 257/706 |

(Continued)

FOREIGN PATENT DOCUMENTS

| | | |
|---|---|---|
| JP | 8-33346 | 2/1996 |
| JP | 10-234158 | 9/1998 |

(Continued)

OTHER PUBLICATIONS

Office Action dated May 8, 2012 in corresponding Japanese Application No. 2010-117689 (with English translation).

(Continued)

*Primary Examiner* — Anatoly Vortman
(74) *Attorney, Agent, or Firm* — Harness, Dickey & Pierce, PLC

(57) ABSTRACT

A controller has a control board, a power module and a power board. MOS transistors, inverter input terminals, coil terminals, inverter ground terminals, control terminals, a control power input terminal and a control ground terminal are integrally molded in a molded portion of a power module. Electrical connections between the power module and the control and power boards are made through the terminals provided in the molded portion.

11 Claims, 18 Drawing Sheets

(56) References Cited

U.S. PATENT DOCUMENTS

| | | | |
|---|---|---|---|
| 7,633,758 B2 * | 12/2009 | Oohama | 361/717 |
| 7,812,443 B2 * | 10/2010 | Tokuyama et al. | 257/706 |
| 7,961,487 B2 * | 6/2011 | Seto et al. | 363/132 |
| 8,027,183 B2 * | 9/2011 | Cho et al. | 363/131 |
| 8,240,411 B2 * | 8/2012 | Nakatsu et al. | 180/65.21 |
| 2001/0036409 A1 | 11/2001 | Murata et al. | |
| 2002/0060105 A1 | 5/2002 | Tominage et al. | |
| 2003/0137858 A1 | 7/2003 | Tsuji et al. | |
| 2004/0090130 A1 | 5/2004 | Kaneko et al. | |
| 2005/0035434 A1 | 2/2005 | Fissore et al. | |
| 2006/0284308 A1 | 12/2006 | Harada et al. | |
| 2008/0002445 A1 * | 1/2008 | Cho et al. | 363/131 |
| 2008/0164607 A1 | 7/2008 | Harada et al. | |
| 2008/0316710 A1 | 12/2008 | Seto et al. | |
| 2009/0251858 A1 | 10/2009 | Harada et al. | |
| 2009/0251859 A1 | 10/2009 | Harada et al. | |
| 2011/0285226 A1 | 11/2011 | Fujita et al. | |

FOREIGN PATENT DOCUMENTS

| | | | | |
|---|---|---|---|---|
| JP | 10-322973 | | 12/1998 | |
| JP | 2005073374 A | * | 3/2005 | H02M 7/48 |
| JP | 2008-061282 | | 3/2008 | |
| JP | 2011030408 A | * | 2/2011 | H02K 11/00 |

OTHER PUBLICATIONS

Office Action dated May 8, 2012 in corresponding (cross-reference) Japanese Application No. 2010-117690 (with English translation).

* cited by examiner

SEMICONDUCTOR MODULE DEVICE AND DRIVING APPARATUS HAVING THE SAME

CROSS REFERENCE TO RELATED APPLICATION

This application is based on Japanese Patent Application No. 2010-117689 filed on May 21, 2010, the disclosure of which is incorporated herein by reference.

FIELD OF THE INVENTION

The present invention relates to a semiconductor module device and a driving apparatus having the same.

BACKGROUND OF THE INVENTION

An inverter device for converting direct current to alternating current is known in the art, wherein semiconductor switching elements, such as transistors, are switched on and off. For example, as disclosed in Japanese Patent No. 3 633 432 (corresponding to U.S. Pat. No. 6,525,950), a semiconductor device is known in the art, wherein semiconductor elements for generating three phase alternating current, positive-polarity direct current terminals, negative-polarity direct current terminals, output terminals and so on are integrally formed.

According to the above prior art, the positive-polarity terminals connected to each positive side of respective semiconductor converting elements as well as the negative-polarity terminals connected to each negative side of the semiconductor converting elements are provided in a semiconductor module device. It is, therefore, difficult to make the module device smaller in size. In addition, it is necessary to provide a control board separately from the semiconductor module device in order to input control signals. Therefore, it is a problem that a number of parts and components will be increased.

SUMMARY OF THE INVENTION

The present invention is made in view of the above problems. It is an object of the present invention to provide a semiconductor module device which can be made smaller in size. It is a further object of the invention to provide a driving apparatus having such a semiconductor module device.

According to a feature of the present invention, a semiconductor module device is provided between a power wiring portion for larger electric current to be supplied to phase coils and a control wiring portion for controlling current supply to the phase coils.

The semiconductor module device has low-voltage side switching elements, high-voltage side switching elements, inverter input terminals, coil terminals, inverter ground terminals, control terminals, a control power input terminal, a control ground terminal, and a molded portion.

The low-voltage side switching elements form a part of an inverter circuit for switching on and off current supply to the phase coils and are provided on a ground side.

The high-voltage side switching elements also form a part of the inverter circuit for switching on and off the current supply to the phase coils and are provided on a higher voltage side than the low-voltage side switching elements.

The inverter input terminals are provided in a molded portion at a side thereof facing to the power wiring portion for connecting the high-voltage side switching elements to a power source portion. When the semiconductor module device is applied to an electric motor, electric power of a power source is supplied to the high-voltage side switching elements, wherein the power source may be a battery and/or a capacitor. On the other hand, when the semiconductor module device is applied to a power generator, electric power generated at the power generator is charged in a power source through the high-voltage side switching elements, wherein the power source may be also a battery and/or a capacitor.

The coil terminals are provided in the molded portion at the side thereof facing to the power wiring portion for connecting the high-voltage side switching elements as well as the low-voltage side switching elements to the phase coils. The inverter ground terminals are provided in the molded portion at the side thereof facing to the power wiring portion for connecting the low-voltage side switching elements to the ground.

The control terminals are provided in the molded portion at another side thereof facing to the control wiring portion, through which control signals for switching on and off the high-voltage side switching elements as well as the low-voltage side switching elements are inputted.

The control power input terminal supplies electric power from the power wiring portion to the control wiring portion. The control ground terminal connects the control wiring portion to a ground portion of the power wiring portion.

The low-voltage side switching elements, the high-voltage side switching elements, the inverter input terminals, the coil terminals, the inverter ground terminals, the control terminals, the control power input terminal and the control ground terminal are integrally molded in the molded portion.

According to the above semiconductor module device, in which the power wiring portion and the control wiring portion are provided separately from each other, the electrical connections between the power wiring portion and the control wiring portion are made through the terminals molded in the molded portion. Therefore, it is not necessary to separately provide jumper wiring portions and so on. As a result, a number of parts and components can be reduced. In addition, a number of assembling processes can be decreased.

According to the above features of the invention, since the control power input terminal for supplying the electric power from the power wiring portion to the control wiring portion as well as the control ground terminal is integrally molded in the molded portion, it is sufficient to electrically connect the power wiring portion to the power source. In other words, it is not necessary to separately provide apart for electrically connecting the control wiring portion to the power source. As a result, a structure for the power module device can be simplified.

In addition, according to the above features of the invention, the electrical connections between the inverter input terminals as well as between the inverter ground terminals are made in the power wiring portion. It is, therefore, not necessary to provide, in the power module, electrical connecting wires for the electrical connections between the inverter input terminals and so on. The semiconductor module device can be made smaller in size.

Furthermore, according to the above features of the invention, the power wiring portion, through which large electric current flows, and the control wiring portion, for which the large electric current is not necessary, are separated from each other. The large electric current flows through power terminals (which includes the inverter input terminals, the coil terminals, and the inverter ground terminals) which are provided in the molded portion on the side facing to the power wiring portion, while control electric current (that is, small electric current) flows through the control terminals which are provided in the molded portion on the other side facing to the control wiring portion. As a result, it is possible to design the respective power terminals and the control terminals, so that each terminal has a proper size depending on the electric current flowing through such terminals.

The semiconductor module device of the invention can be applied to a driving apparatus having an electric motor and a controller for controlling the electric motor.

According to another features of the invention, a driving apparatus has an electric motor, a heat sink, a semiconductor module, a control wiring portion, and a power wiring portion. The electric motor has a motor casing, a stator, a rotor, and a rotating shaft. The motor casing is of a cylindrical shape. The stator is fixed to an inner wall of the motor casing and having a winding being composed of multiple phase coils. The rotor is movably accommodated in the stator so that the rotor is rotatable relative to the stator. The rotating shaft is rotatable together with the rotor.

The heat sink has a heat receiving surface extending in an axial direction of the motor casing from an axial end of the motor casing. The semiconductor module is arranged along the heat receiving surface of the heat sink. The control wiring portion has a control portion for controlling an operation of the electric motor and electrically connected to the semiconductor module. The power wiring portion is electrically connected to the semiconductor module, so that coil current to be supplied to the phase coils flows through the power wiring portion. The motor casing, one of the control wiring portion and the power wiring portion, the heat sink, the semiconductor module, and the other of the control wiring portion and the power wiring portion, are axially arranged in this order.

The semiconductor module has, low-voltage side switching elements, high-voltage side switching elements, inverter input terminals, coil terminals, inverter ground terminals, control terminals, a control power input terminal, a control ground terminal, and a molded portion.

The low-voltage side switching elements form a part of an inverter circuit for switching on and off the current supply to the phase coils and are provided on a ground side. The high-voltage side switching elements also form a part of the inverter circuit for switching on and off the current supply to the phase coils and are provided on a higher voltage side than the low-voltage side switching elements.

The inverter input terminals are provided in the molded portion at a side thereof facing to the power wiring portion for connecting the high-voltage side switching elements to a power source portion. As a result, electric power of the power source portion is supplied to the high-voltage side switching elements, wherein the power source may be a battery and/or a capacitor.

The coil terminals are provided in the molded portion at the side thereof facing to the power wiring portion for connecting the high-voltage side switching elements as well as the low-voltage side switching elements to the phase coils. The inverter ground terminals are provided in the molded portion at the side thereof facing to the power wiring portion for connecting the low-voltage side switching elements to the ground.

The control terminals are provided in the molded portion at another side thereof facing to the control wiring portion, through which control signals for switching on and off the high-voltage side switching elements as well as the low-voltage side switching elements are inputted.

The control power input terminal supplies electric power from the power wiring portion to the control wiring portion. The control ground terminal connects the control wiring portion to a ground portion of the power wiring portion.

The low-voltage side switching elements, the high-voltage side switching elements, the inverter input terminals, the coil terminals, the inverter ground terminals, the control terminals, the control power input terminal and the control ground terminal are integrally molded in the molded portion.

According to the above features of the invention, the power module is arranged along the heat receiving surface of the heat sink axially extending from the end surface of the motor casing. In other words, the power module is not arranged in parallel to the end surface of the motor casing but arranged in a vertical direction with respect to the end surface of the motor casing. It is, therefore, possible to effectively use a virtual motor casing space which is formed at an axial end of the motor casing by projecting the motor casing in the axial direction. A size of the driving apparatus in the radial direction can be made smaller.

The control wiring portion, the power module, the heat sink and the power wiring portion are assembled as one unit, which is referred to as a controller. Since, according to the driving apparatus of the invention, the controller is arranged at the axial end of the electric motor, the size of the driving apparatus in the radial direction can be made smaller.

In addition, since the electric motor and the controller are separated from each other in the axial direction, it is relatively easier to take out the controller 3 from the electric motor 2. Therefore, even in a case that the required output of the electric motor is changed, it is easier to modify a design of the controller, for example, by simply changing a heat capacity of the heat sink. It is, therefore, possible to manufacture the driving apparatuses having different specifications, when the parts and/or components are standardized. In addition, even when either the electric motor or the controller is broken down, it is easier to repair the apparatus by exchanging only the component (the electric motor or the controller) which is broken.

The power wiring portion, through which the large electric current flows, and the control wiring portion, for which the large electric is not necessary, are separated from each other. Therefore, when the control wiring portion is formed on a printed circuit board, it is possible to make copper foil of the printed circuit board, since small electric current may flow through the printed circuit board.

According to the above features of the invention, the low-voltage side switching elements, the high-voltage side switching elements, the inverter input terminals, the coil terminals, the inverter ground terminals, the control terminals, the control power input terminal and the control ground terminal are integrally molded in the molded portion. Since the power wiring portion and the control wiring portion are separately provided from each other, the electrical connections among the power wiring portion, the control wiring portion and the power module are made by the terminals integrally molded in the molded portion. It is, therefore, not necessary to separately provide jumper wiring parts and so on. As a result, a number of parts and components can be reduced. In addition, a number of assembling processes can be decreased.

According to the above features of the invention, since the control power input terminal for supplying the electric power from the power wiring portion to the control wiring portion as well as the control ground terminal is integrally molded in the molded portion, it is sufficient to electrically connect the power wiring portion to the power source. In other words, it is not necessary to separately provide apart for electrically connecting the control wiring portion to the power source. As a result, a structure for the power module device can be simplified.

In addition, according to the above features of the invention, the electrical connections between the inverter input terminals as well as the electrical connections between the inverter ground terminals are respectively made in the power wiring portion. It is, therefore, not necessary to provide, in the power module, electrical connecting wires for the electrical connections between the inverter input terminals and so on. The semiconductor module device can be made smaller in size.

Furthermore, according to the above features of the invention, the power wiring portion, through which large electric current flows, and the control wiring portion, for which the large electric current is not necessary, are separated from each other. The large electric current flows through power terminals (which includes the inverter input terminals, the coil terminals, and the inverter ground terminals) which are provided in the molded portion on the side facing to the power wiring portion, while control electric current (that is, small electric current) flows through the control terminals which are provided in the molded portion on the other side facing to the control wiring portion. As a result, it is possible to design the respective power terminals and the control terminals, so that each terminal has a proper size depending on the electric current flowing through such terminal.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

Figure 1:
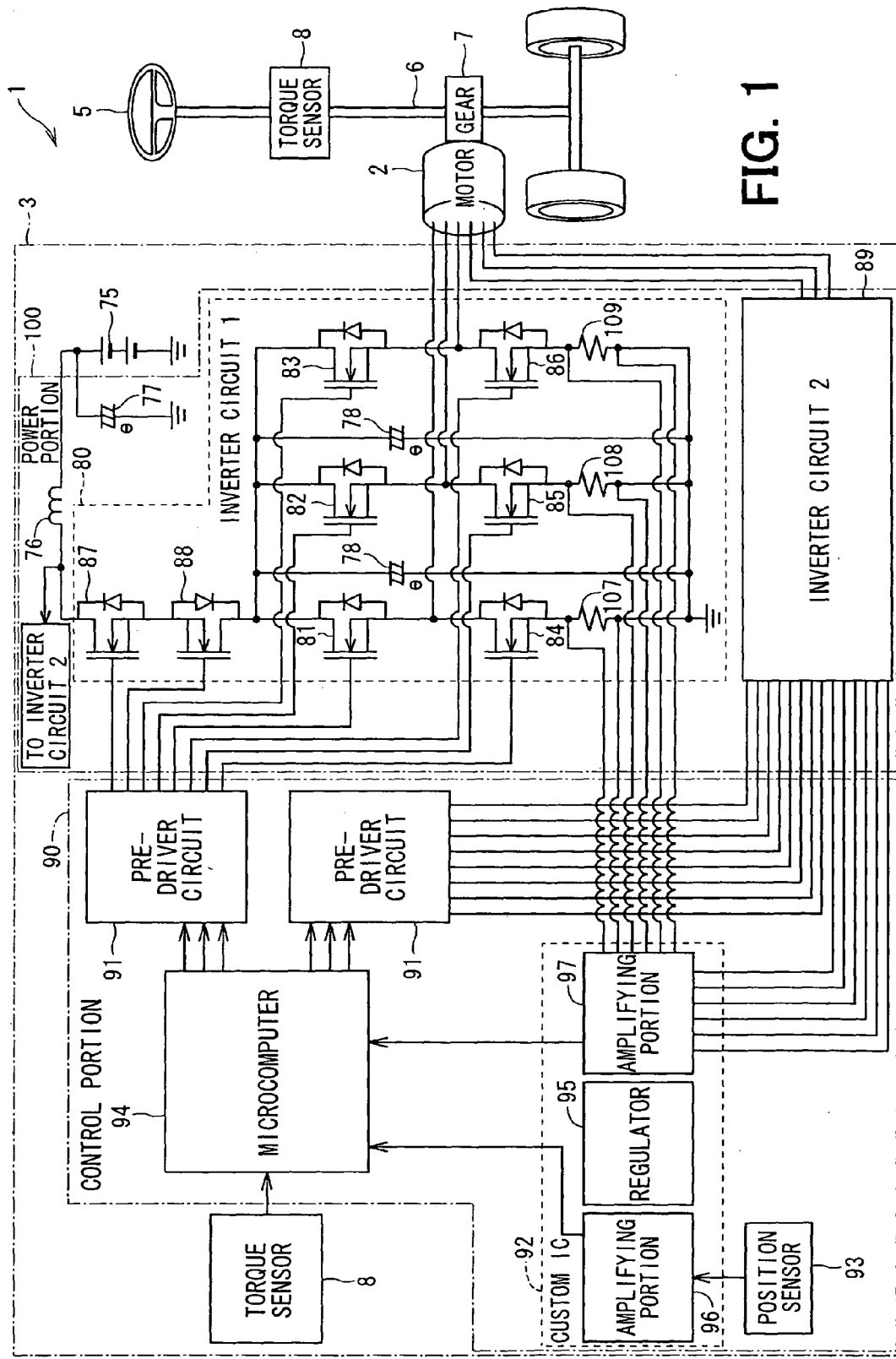
FIG. 1 is a schematic diagram showing a structure of a power steering apparatus for a vehicle according to a first embodiment of the present invention.

A semiconductor module device of the present invention as well as a driving apparatus having such semiconductor module device will be explained by way of multiple embodiments with reference to the drawings.

The same reference numerals are used throughout the embodiments for the purpose of designating the same or similar part or portion, to thereby omit repeated explanation as much as possible.

(First Embodiment)

A driving apparatus according to a first embodiment of the present invention is shown in FIGS. 1 to 20. The driving apparatus 1 of the present embodiment is applied to an electric power steering device (EPS) for a vehicle. The driving apparatus 1 has an electric motor 2 and a controller (an electronic controller) 3, which is composed of; a control board 40 as a control wiring portion; a heat sink 50; a power module 60 as a semiconductor module portion; a power board 70 as a power wiring portion, and so on.

At first, an electrical structure for the EPS will be explained with reference to FIG. 1. The electrical structure of FIG. 1 will be also applied to other embodiments explained below.

As shown in FIG. 1, the driving apparatus 1 generates a rotational torque transmitted to a column shaft 6 via a gear 7, so that a steering operation of a steering wheel 5 is assisted. More exactly, when the steering wheel 5 is operated by a vehicle driver, a steering torque generated at the column shaft 6 is detected by a torque sensor 8 and a vehicle speed is obtained via CAN (Controller Area Network) so as to assist the steering operation of the vehicle driver. It is also possible to apply the driving apparatus 1 to an automatic steering control, so that the steering operation is automatically controlled in order to keep a traveling lane on a highway, to lead a parking operation to a parking space and so on, in addition to an assistance of the steering wheel operation.

The electric motor 2 is a brushless motor for driving the gear 7 in a forward direction or in a backward direction. An operation of the electric motor 2 (including supply of electrical power) is controlled by the controller 3. The controller 3 is composed of a power portion 100 in which driving current for driving the electric motor 2 flows and a control portion 90 for controlling a driving operation of the electric motor 2.

The power portion 100 has a choke coil 76 provided on a power supply line from a power source (a vehicle battery) 75, a capacitor 77, and a pair of inverters (first and second inverter circuits) 80 and 89. The first and second inverters 80 and 89 are identical to each other. Therefore, only the first inverter 80 will be explained.

The inverter 80 has multiple MOSFETs 81 to 86 (metal-oxide semiconductor field-effect transistor; hereinafter simply referred to as a MOS transistor). In each of the MOS transistors 81 to 86, an electrical path between a source and a drain is turned on or off depending on electric potential at a gate thereof.

The drain of the MOS transistor 81 is connected to the power supply line, while the source thereof is connected to the drain of the MOS transistor 84. The source of the MOS transistor 84 is grounded. A connecting point between the MOS transistors 81 and 84 is connected to a U-phase coil of the electric motor 2.

In a similar manner, the drain of the MOS transistor 82 is connected to the power supply line, while the source thereof is connected to the drain of the MOS transistor 85. The source of the MOS transistor 85 is grounded. A connecting point between the MOS transistors 82 and 85 is connected to a V-phase coil of the electric motor 2.

And, the drain of the MOS transistor 83 is connected to the power supply line, while the source thereof is connected to the drain of the MOS transistor 86. The source of the MOS transistor 86 is grounded. A connecting point between the MOS transistors 83 and 86 is connected to a W-phase coil of the electric motor 2.

The MOS transistors 81 to 83 connected to the power supply line correspond to switching elements on a high electrical potential side, while the MOS transistors 84 to 86 grounded to the earth correspond to switching elements on a low electrical potential side. Hereinafter, the MOS transistors 81 to 83 are also referred to as upper side MOS transistors (or high-voltage side switching elements), while the MOS transistors 84 to 86 are referred to as lower side MOS transistors (or low-voltage side switching elements).

The inverter 80 has power-source relays 87 and 88 as a cut-off means. The power-source relays 87 and 88 are also made of MOSFETs like the MOS transistors 81 to 86. The power-source relays 87 and 88 are provided between the power source 75 and the MOS transistors 81 to 83, so as to cut off the power supply to the MOS transistors 81 to 83 in case of an abnormal condition. The power-source relay 87 is provided in order to cut off the electric current to the electric motor 2, when any malfunction, such as a disconnection, a short-circuit or the like, has occurred. The power-source relay 88 is provided in order to prevent the electric current from flowing in a reversed direction, for example, in a case that an electric part, such as a capacitor 78, is accidentally connected in a reversed condition.

Shunt resisters 107 to 109 are electrically connected between each of the MOS transistors 84 to 86 and the ground as current detecting means. Electrical voltage or current applied to the shunt resisters 107 to 109 is detected in order to detect electric current flowing through the U-phase, V-phase and W-phase coils. More exactly, the shunt resister 107 is provided between the U-phase lower side MOS transistor 84 and the ground so as to detect the electric current flowing through the U-phase coil. In a similar manner, the shunt resister 108 is provided between the V-phase lower side MOS transistor 85 and the ground so as to detect the electric current flowing through the V-phase coil, and the shunt resister 109 is provided between the W-phase lower side MOS transistor 86 and the ground so as to detect the electric current flowing through the W-phase coil.

The choke coil 76 is electrically connected between the power source 75 and the power-source relay 87, while the capacitor 77 is connected between the power source 75 and the ground. The choke coil 75 and the capacitor 77 forms a filter circuit in order to reduce noises transmitted from other devices commonly connected to the power source 75. In addition, it reduces the noises to be transmitted to the other devices connected to the power source 75.

Capacitors 78 are electrically connected between a power-source side of the MOS transistors 81 to 83 connected to the power supply line and a ground side of the MOS transistors 84 to 86 connected to the ground. The capacitors 78 may accumulate electric charge, so that they assist power supply to the MOS transistors 81 to 86 or suppress noise components such as surge voltage.

The control portion 90 has pre-driver circuits 91, a custom IC 92, a position sensor 93, and a micro-computer 94. The custom IC 92 includes a regulator 95, an amplifying portion 96 for a position sensor signal, and an amplifying portion 97 for detecting current.

The regulator 95 is a stabilization circuit for stabilizing the power supply to the respective portions. For example, the micro-computer 94 operates with a stabilized predetermined voltage (for example, 5 volt) from the regulator 95.

A sensor signal from the position sensor 93 is inputted to the amplifying portion 96. The position sensor 93 detects a rotational position of the electric motor 2 and such detected rotational position (a rotational position signal) is supplied to the amplifying portion 96. The rotational position signal is amplified by the amplifying portion 96 and then supplied to the micro-computer 94.

The amplifying portion 97 detects the voltage across the shunt resisters 107 to 109 and amplifies the detected voltage to output it to the micro-computer 94.

As above, the rotational position signal of the electric motor 2 as well as the voltage across the shunt resisters 107 to 109 is inputted to the micro-computer 94. In addition, steering torque signal from the torque sensor 8 provided at the column shaft 6 is inputted to the micro-computer 94. Furthermore, information of vehicle speed is inputted to the micro-computer 94 via the CAN. The micro-computer 94 controls the inverter 80 in accordance with the rotational position signal via the pre-driver circuit 91, when the steering torque signal and the information of the vehicle speed are inputted to the micro-computer 94, so that the steering operation is assisted depending on the vehicle speed. More exactly, the micro-computer 94 controls ON/OFF conditions of the MOS transistors 81 to 86 via the pre-driver circuit 91, to thereby control the inverter 80. In other words, since each of the gates of the MOS transistors 81 to 86 is connected to respective output terminals of the pre-driver circuit 91, the ON/OFF condition of the respective MOS transistors 81 to 86 is controlled by changing gate voltage by the pre-driver circuit 91.

In addition, the micro-computer 94 controls the inverter 80, based on the voltages across the shunt resisters 107 to 109 which are inputted from the amplifying portion 97, so that the electric current supplied to the electric motor 2 becomes in a form of a sine wave. The control portion 90 controls the second inverter 89 in the same manner to the first inverter 80.

Now, a structure of the driving apparatus 1 will be explained with reference to FIGS. 2 to 19.

Figure 16:
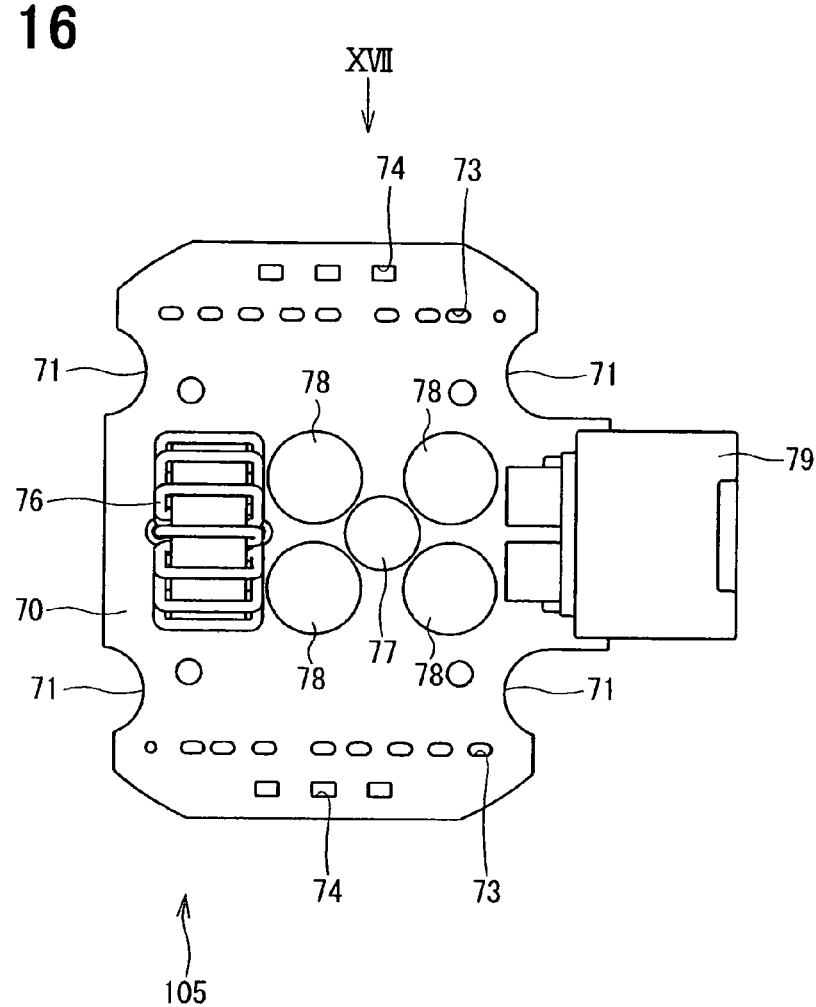
FIG. 16 is a schematic top plan view showing a power unit of the first embodiment.
Figure 17:
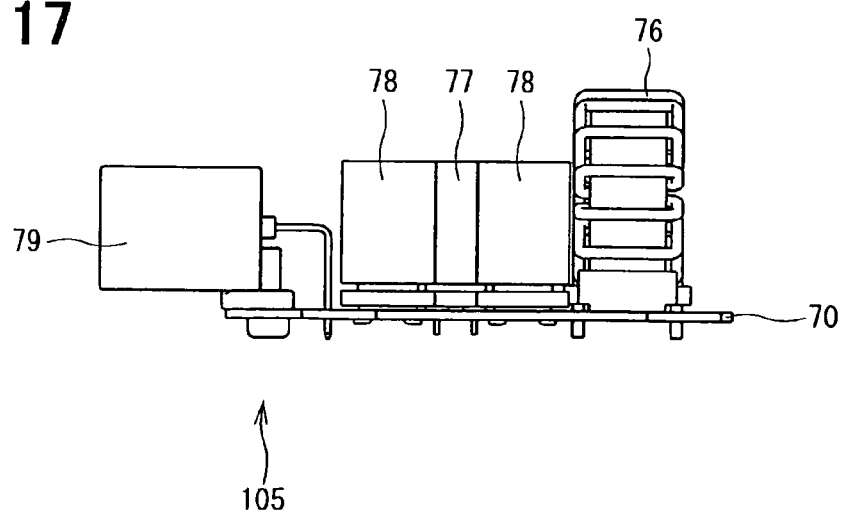
FIG. 17 is a schematic side view of the power unit when viewed in a direction of an arrow XVII in FIG. 16.
Figure 18:
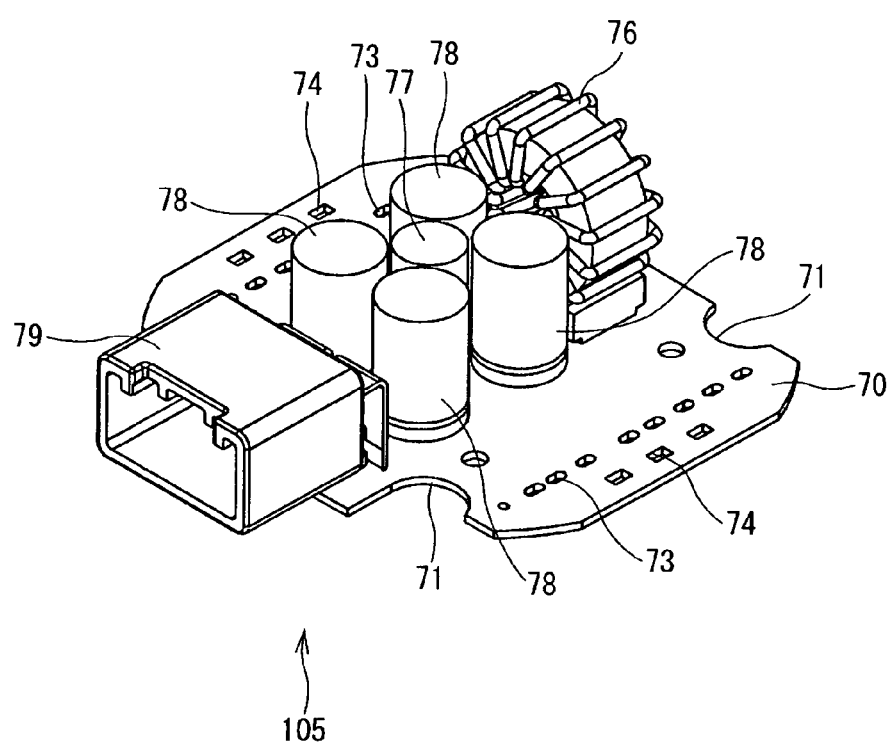
FIG. 18 is a schematic perspective view showing the power unit of the first embodiment.
Figure 19:
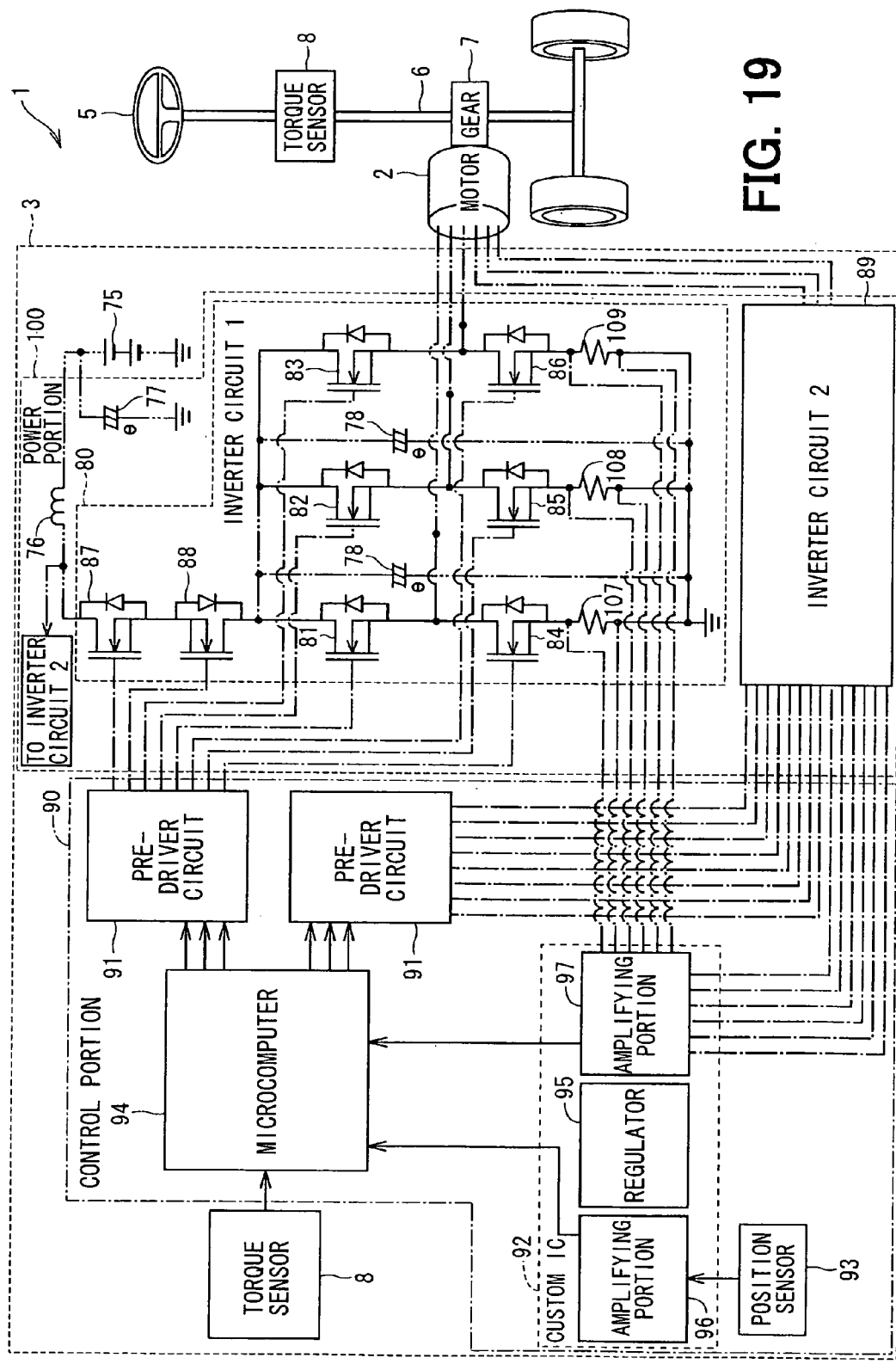
FIG. 19 is a diagram for explaining a control wiring portion and a power wiring portion of the first embodiment.

FIGS. 2 to 6 are drawings for showing the entire structure of the driving apparatus 1. FIGS. 7 to 11 are drawing for showing the controller 3. FIGS. 12 to 15 are drawings for showing the heat sink 50 and the power module 60. FIGS. 16 to 18 are drawings for showing a power unit 105. FIG. 19 corresponds to FIG. 1 for explaining a circuit structure of the control board 40 and the power board 70.

According to the driving apparatus 1 of the present embodiment, the controller 3 is provided at one axial end of the electric motor 2 in a laminated structure.

At first, the electric motor 2 will be explained with reference to FIG. 2. The electric motor 2 has a motor casing 10, a stator 20, a rotor 30, a rotating shaft 35 and so on.

The motor casing 10 is made of iron and formed in a cylindrical shape. An end frame 14 made of aluminum is fixed to one axial end of the motor casing 10 (a lower end in FIG. 2), which is a side opposite to the controller 3, by bolts or the like. An aperture 11 is formed at a center of the other axial end of the motor casing 10 (an upper end in FIG. 2), which is a side of the controller 3. The rotating shaft 35 is inserted through the aperture 11.

A guide member 16 made of resin is provided at the axial end (the upper end) of the motor casing 10 on the side of the controller 3. The guide member 16 is formed in a cylindrical shape and has an opening at its center.

The stator 20 is arranged in an inside of the motor casing 10. The stator 20 has twelve projecting poles 21, each of which projects in a radial inward direction. The projecting poles 21 are provided in a circumferential direction at equal intervals. The stator 20 has a laminated stator core 23, wherein multiple thin metal plates made of magnetic material are laminated in an axial direction of the electric motor 2. The stator 20 has insulators (not shown) attached to axial ends of the laminated stator core 23, on which windings 26 are wound. The windings 26 are composed of three-phase windings having a U-phase coil, a V-phase coil and a W-phase coil.

The rotor 30 is movably arranged in an inside of the stator 20, so that the rotor 30 is rotatable relative to the stator 20. The rotor 30 is made of magnetic material (such as, iron) and formed in a cylindrical shape. The rotor 30 has a rotor core 31 and a permanent magnet 32 provided at an outer periphery of the rotor core 31, wherein the magnet 32 is magnetized in such a manner that N-poles and S-poles are alternately arranged in a circumferential direction.

The rotating shaft 35 is fixed to a center bore 33 of the rotor core 31. The rotating shaft 35 is rotatably supported by a bearing 12 provided in the motor casing 10 and a bearing 15 provided in the end frame 14. The rotating shaft 35 is rotatable together with the rotor 30 with respect to the stator 20.

The rotating shaft 35 has a magnet 36 at its axial end (an upper end in FIG. 2) on a side of the controller 3. Since the upper portion of the rotating shaft 35 is inserted through the aperture 11 of the motor casing 10, the magnet 36 attached to the upper end of the rotating shaft 35 is outwardly projected toward the controller 3 from the motor casing 10. According to the present embodiment, the upper end of the rotating shaft 35 does not extend through the control board 40, so that the magnet 36 is opposed to but located adjacent to a lower surface 41 of the control board 40 on a side of the electric motor 2.

Figure 2:
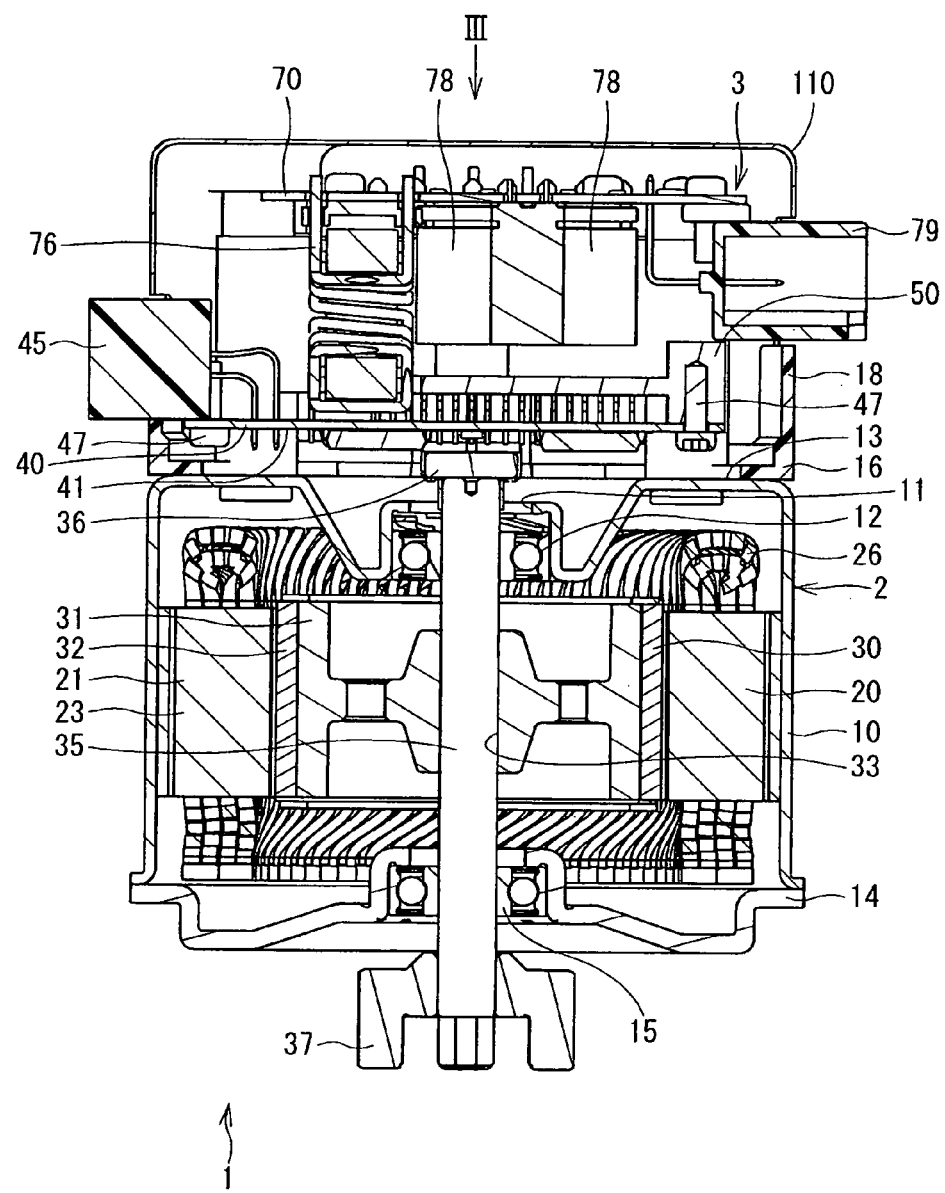
FIG. 2 is a schematic cross sectional view showing a driving apparatus according to the first embodiment of the present invention.
Figure 3:
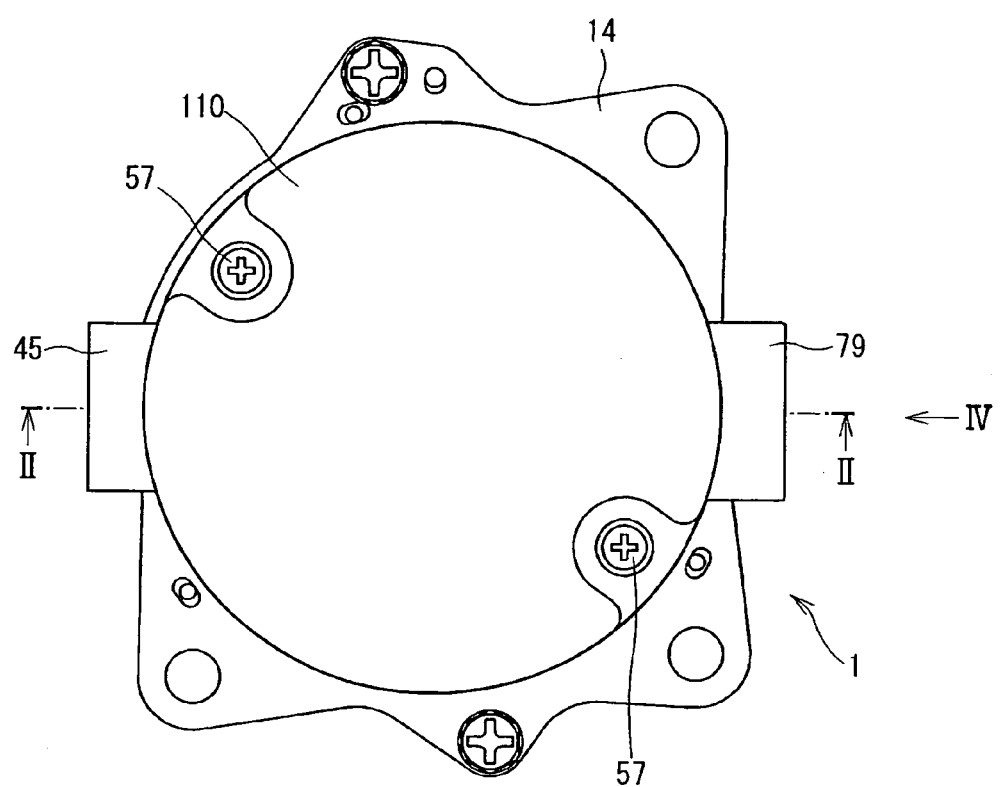
FIG. 3 is a schematic top plan view showing the driving apparatus according to the first embodiment of the present invention.
Figure 4:
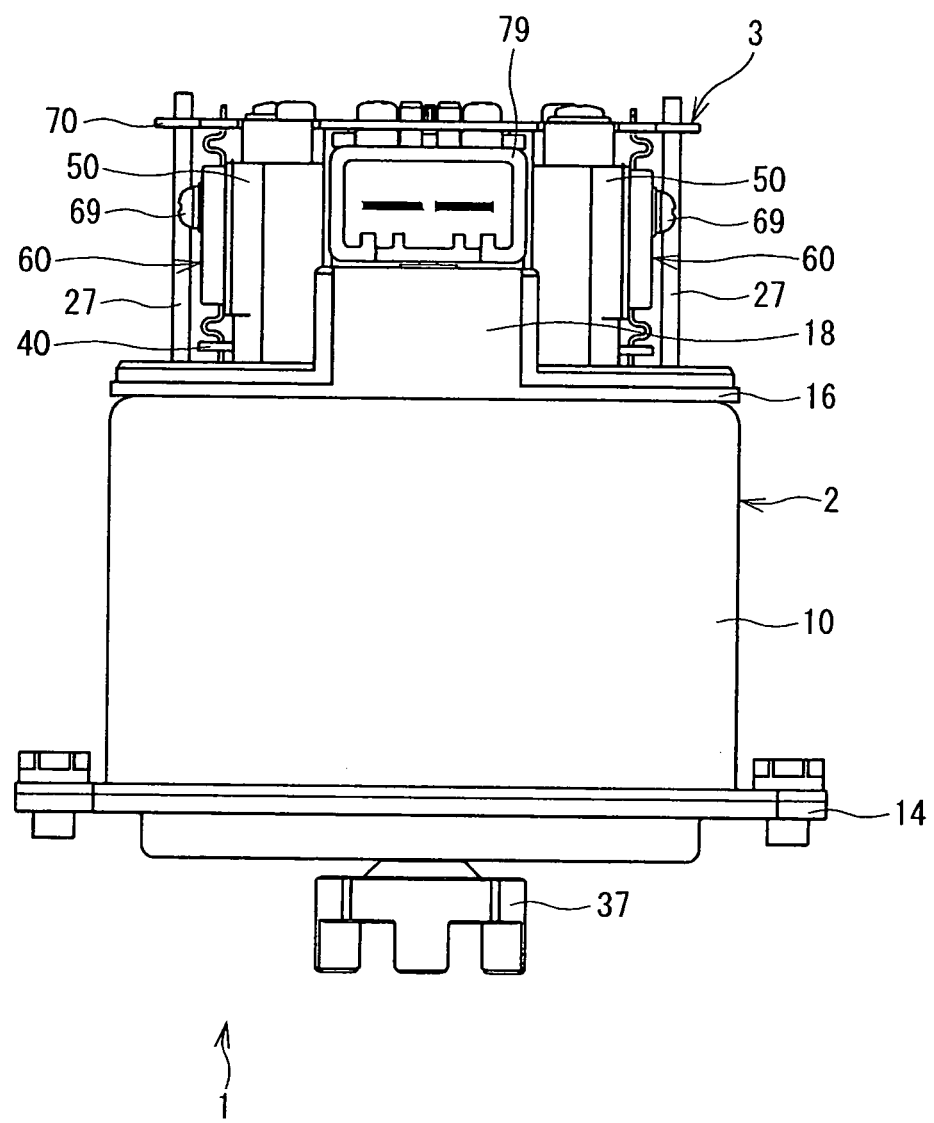
FIG. 4 is a schematic side view showing the driving apparatus when viewed in a direction of an arrow IV in FIG. 3, wherein a motor cover is removed.

The rotating shaft 35 has an output portion 37 at the other end thereof (at a lower end in FIG. 2). A gear box (not shown) having therein the gear 7 is provided at a side of the motor 2 opposite to the controller 3, that is, a lower side of FIG. 2, so that the gear 7 is engaged with the output portion 37 and rotated by rotational force of the rotating shaft 35.

Figure 5:
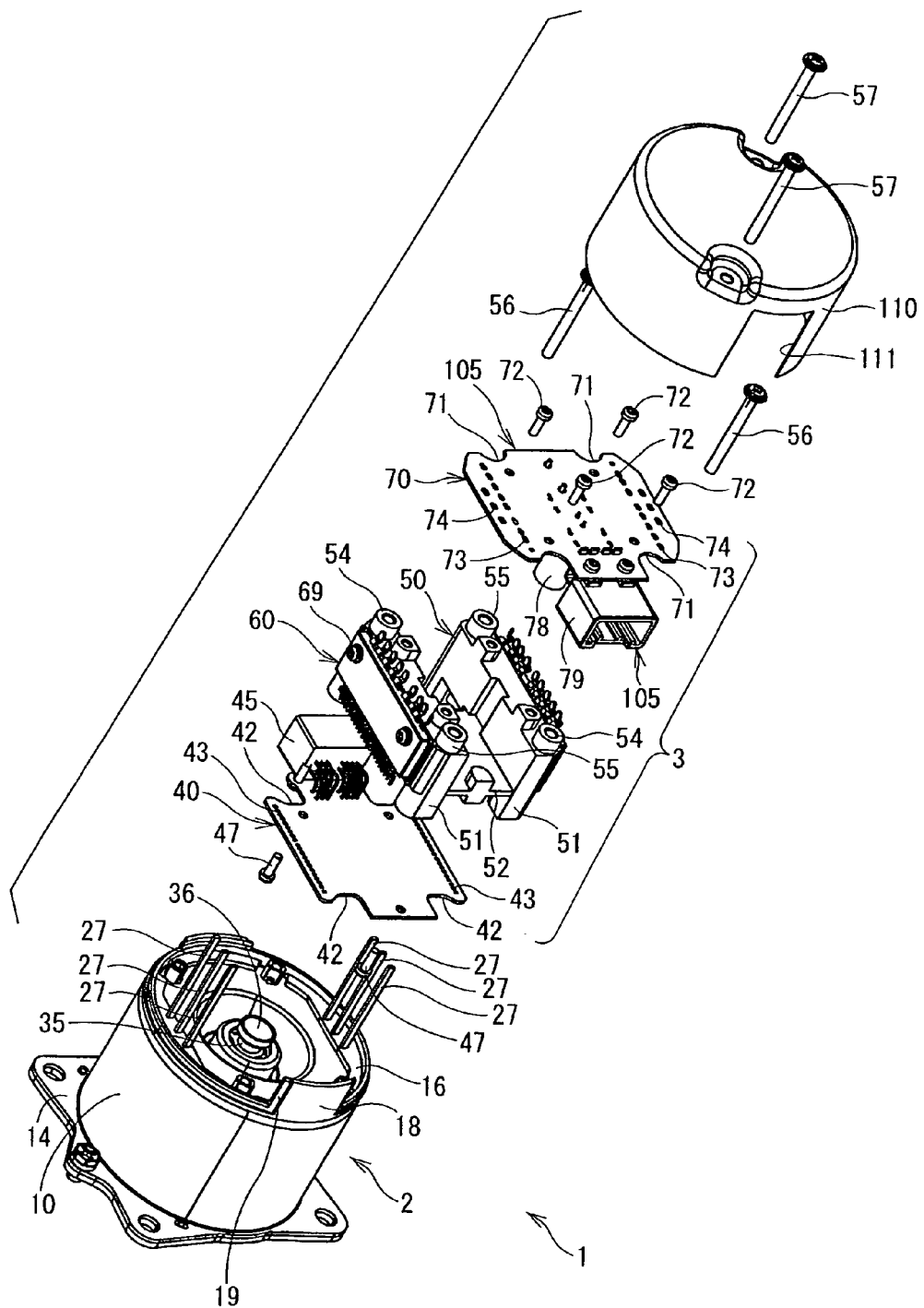
FIG. 5 is an exploded perspective view schematically showing the driving apparatus of the first embodiment.
Figure 6:
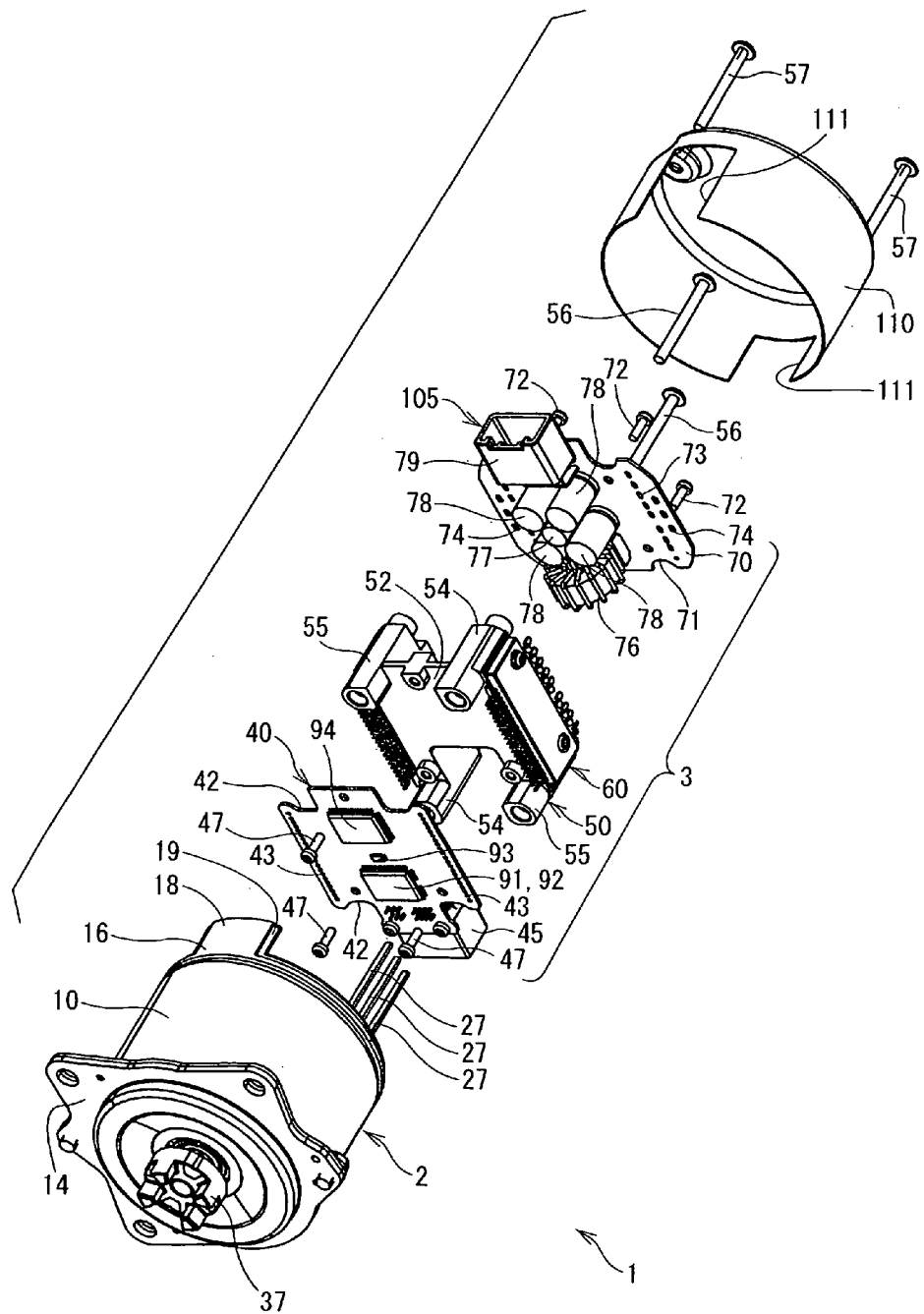
FIG. 6 is also an exploded perspective view, when viewed in a different direction, which schematically shows the driving apparatus of the first embodiment.
Figure 7:
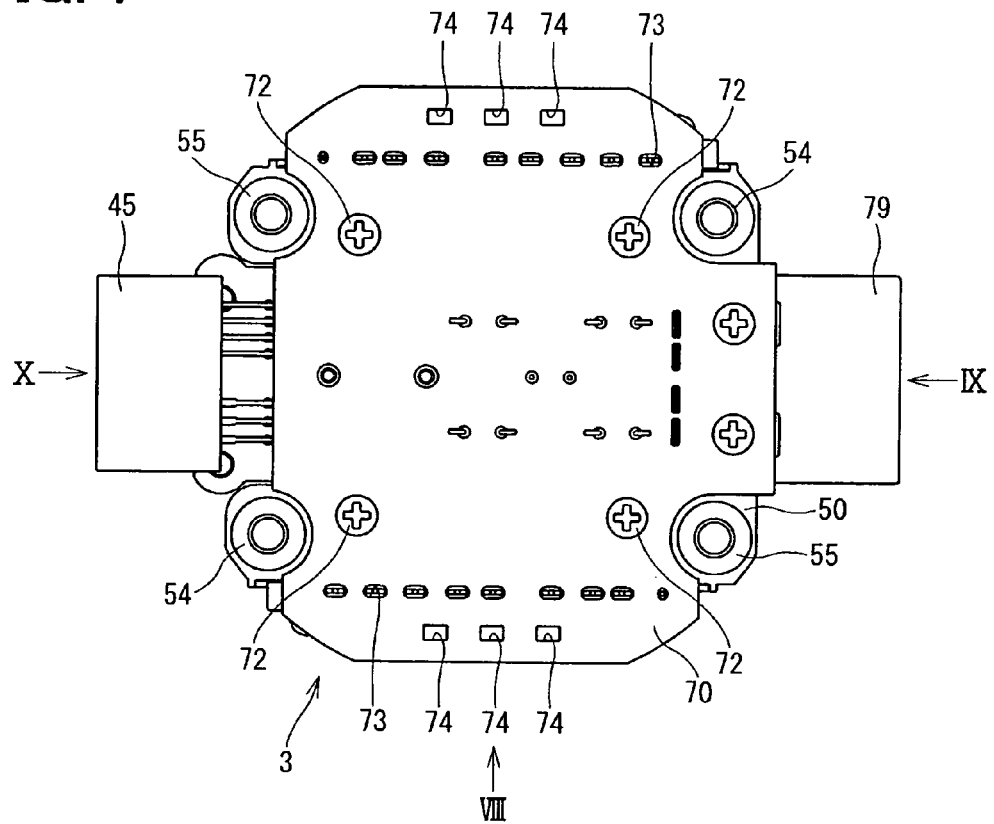
FIG. 7 is a schematic top plan view showing an electronic controller of the first embodiment.
Figure 8:
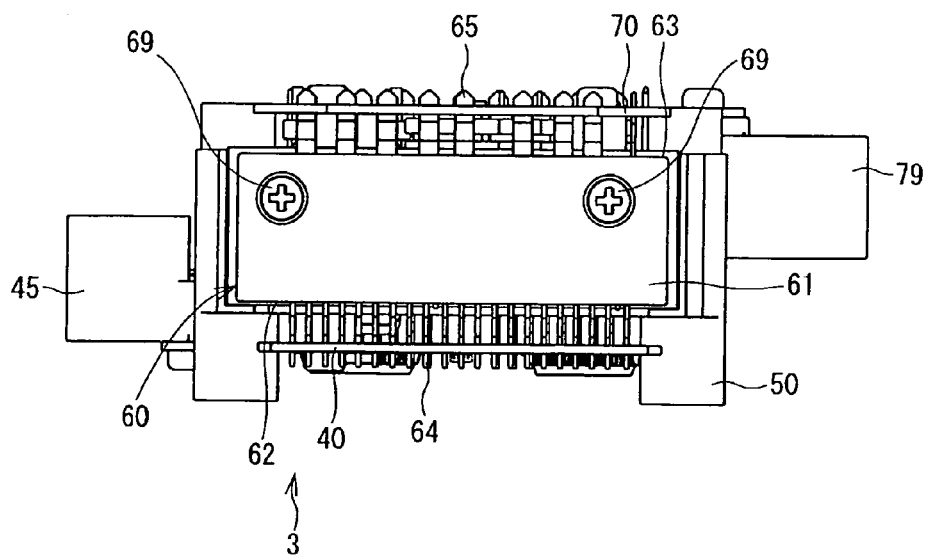
FIG. 8 is a schematic side view of the controller when viewed in a direction of an arrow VIII in FIG. 7.
Figure 9:
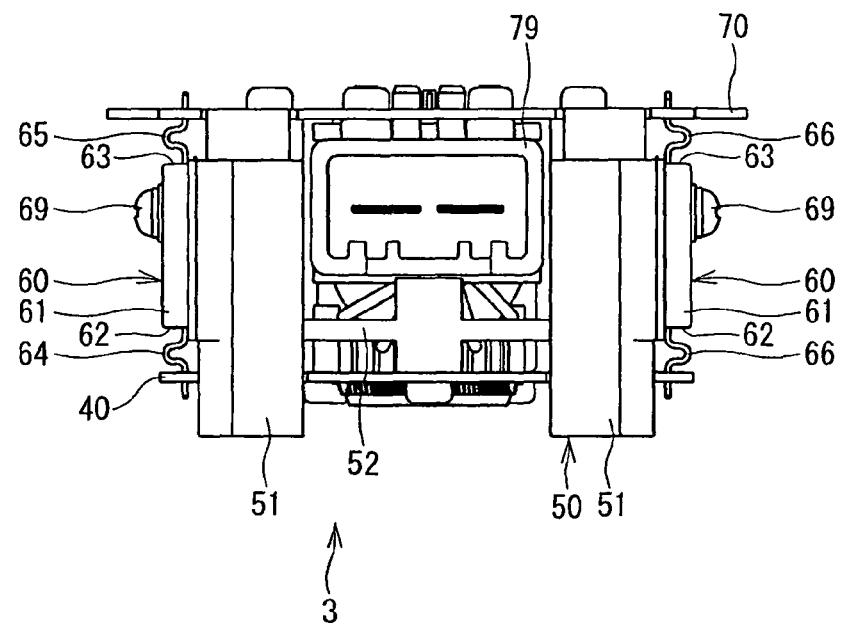
FIG. 9 is a schematic side view of the controller when viewed in a direction of an arrow IX in FIG. 7.

As shown in FIGS. 5 and 6, stator coil terminals 27 are pulled out from six portions of the stator windings 26. Each of the stator coil terminals 27 is inserted through respective six through-holes formed in the resin-made guide member 16, so that the stator coil terminals 27 are rigidly positioned and supported by the guide member 16. In addition, the control board 40 is insulated from the motor casing 10 by the guide member 16. The stator coil terminals 27 pass nearby at radial outward peripheries of the control board 40 and the power module 60 and then the stator coil terminals 27 are connected to the power board 70. In other words, when viewed in the axial direction of the electric motor 2, the stator coil terminals 27 are arranged at a radial outer side of the power module 60. Namely, the stator coil terminals 27 overstride the power module 60 in the axial direction and extend to the power board 70.

The controller 3 will be explained with reference to FIGS. 5 to 18. The controller 3 is arranged in a virtual motor casing space, which is formed at the axial side of the motor casing 10 by projecting the motor casing 10 in the axial direction. In the controller 3, the control board 40, the heat sink 50 and the power modules 60, and the power board 70 are located in this order in the axial direction of the electric motor 2 from the motor casing 10.

The control board 40 is made of, for example, a four-layered board formed of glass-epoxy boards. The control board 40 is formed in an almost rectangular shape, so that the control board 40 is accommodated in the virtual motor casing space. Notched portions 42 are formed at four corners of the control board 40, so that the heat sink 50 is assembled to the motor casing 10 through such notched portions 42. The control board 40 is fixed to the heat sink 50 by screws or bolts 47 from a side of the electric motor 2.

Various kinds of electronic parts for the control portion 90 (FIG. 1) are mounted on the control board 40. The pre-driver circuits 91, the custom IC 92, the position sensor 93 and the micro-computer 94 are mounted on the control board 40 on the side to the electric motor 2. More exactly, the wiring portions indicated by one-dot-chain lines as well as the electronic parts surrounded by a one-dot-chain line in FIG. 19 are provided on the control board 40.

The position sensor 93 is located at almost a center of the control board 40 so that the position sensor 93 is opposed to the magnet 36 attached to the rotating shaft 35. The position sensor 93 detects change of magnetic field of the magnet 36, which is rotated together with the rotating shaft 35, to thereby detect the rotation 5 of the rotating shaft 35. The control board 40 has multiple through-holes 43 at both longitudinal sides thereof. The through-holes 43 are respectively connected to control terminals 64 of the power modules 60. A control connector 45 is connected to the control board 40 on a side thereof opposite to the electric motor 2 at a longitudinal end. Multiple external terminals (not shown) are connected to the control connector 45 in a radial direction of the electric motor 2, so that various kinds of sensor information are inputted.

The heat sink 50 has a pair of heat radiating blocks 51, which are formed as column portions and separated from each other. A connecting portion 52 is provided between the heat radiating blocks 51. The heat radiating blocks 51 as well as the connecting portion 52 are made of material having high heat conductivity, such as aluminum, and they are integrally formed. According to the present embodiment, each of the heat radiating blocks 51 arranged at a position, which is at a radial outside of a center line of the electric motor 2, which is a virtual line extending from the rotating shaft 35.

Figure 10:
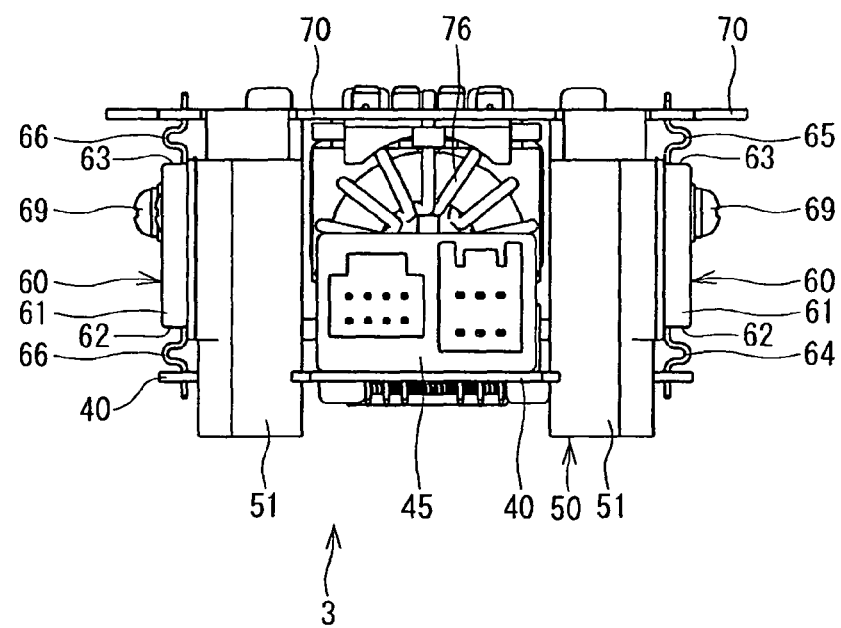
FIG. 10 is a schematic side view of the controller when viewed in a direction of an arrow X in FIG. 7.
Figure 12:
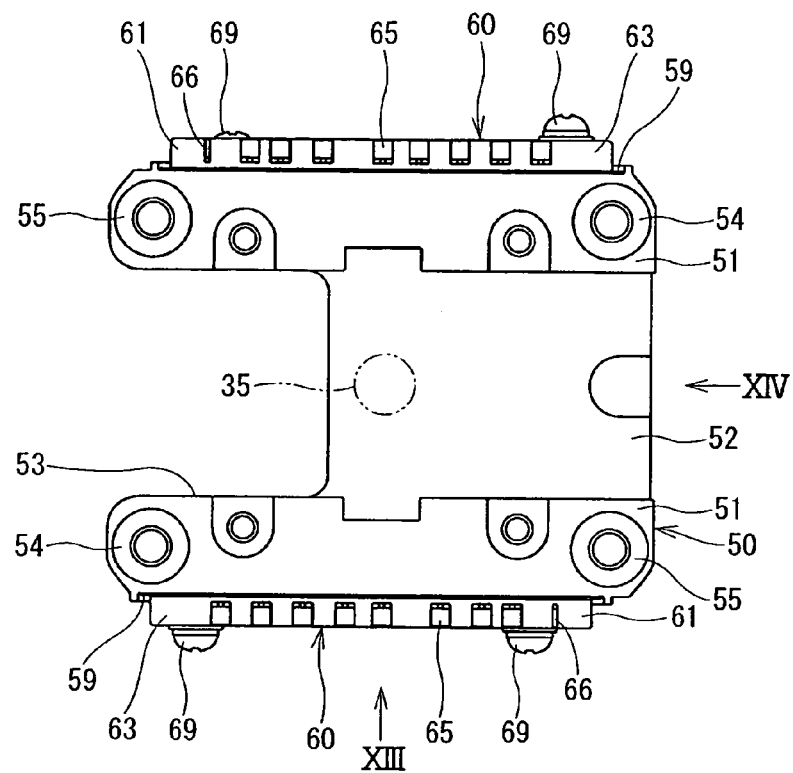
FIG. 12 is a schematic top plan view showing a heat sink of the first embodiment, to which power modules are fixed.
Figure 14:
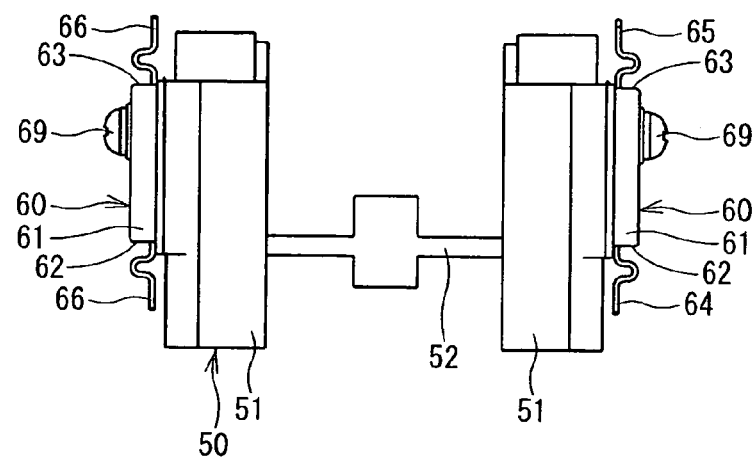
FIG. 14 is a schematic side view of the heat sink with the power modules when viewed in a direction of an arrow XIV in FIG. 12.
Figure 15:
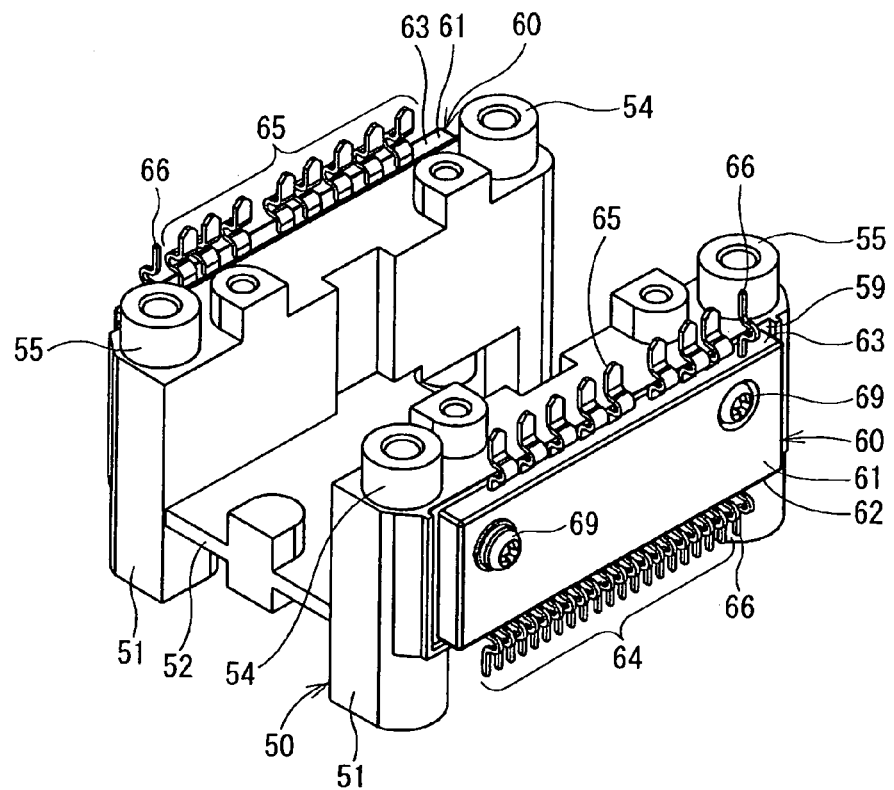
FIG. 15 is a schematic perspective view showing the heat sink with the power modules.

As shown in FIG. 14, the heat sink 50 has an H-shaped structure, when viewed in a direction of an arrow XIV in FIG. 12. In addition, as shown in FIG. 12, the heat sink 50 has a C-shaped structure, when viewed in the axial direction of the electric motor 2. A space 53 is formed between the heat radiating blocks 51 at one longitudinal side of the heat sink 50, at which the connecting portion 52 is not formed. The control connector 45 is accommodated in the space 53, as shown in FIG. 10.

Each of the heat radiating blocks 51 is formed in a wide column shape, extending in the longitudinal direction, as shown in FIG. 12. Fixing portions 54 and 55 are formed at both longitudinal ends of the respective heat radiating blocks 51. A through-hole extending in the axial direction of the electric motor is formed at the respective fixing portions 54 and 55. Bolts 56 are inserted into the through-holes of the fixing portions 54, so that the heat sink 50 is fixed to the motor casing 10. Bolts 57 are inserted into the through-holes of the fixing portions 55, so that the heat sink 50 is fixed to the motor casing 10 together with a motor cover 110 (explained below). The fixing portion 54 of one heat radiating block 51 and the fixing portion 54 of the other heat radiating block 51 are arranged symmetrically with respect to the center line of the rotating shaft 35. In the same manner, the fixing portions 55 of the heat radiating blocks 51 are arranged symmetrically with respect to the center line of the rotating shaft 35.

Each of the heat radiating blocks 51 has a heat receiving surface 59 at a radial outward side thereof. The heat receiving surface 59 extends in the axial direction of the electric motor 2 from the motor casing 10. According to the present embodiment, the heat receiving surface 59 is arranged at almost a right angle to an end surface 13 (FIG. 2) of the motor casing 10.

Each of the power modules 60 is located at each outer side of the heat receiving surface 59. Namely, the power modules 60 are arranged at radial outward sides of the heat sink 50.

The power module 60 has multiple control terminals 64 and multiple power terminals 65, each of which extends from a molded portion 61 in the axial direction of the electric motor 2.

The control terminals 64 outwardly extend from a first surface 62, which is an axial end surface of the molded portion 61 (in a downward direction from a lower end surface in FIG. 14). The power terminals 65 outwardly extend from a second surface 63 (in an upward direction from an upper end surface in FIG. 14), which is another axial end surface of the molded portion 61 opposite to the first surface 61. According to the present embodiment, the power module 60 is arranged at the heat receiving surface 59 of the heat sink 50, so that the first surface 62 (for the control terminals 64) is opposed to the control board 40, while the second surface 63 (for the power terminals 65) is opposed to the power board 70. In other words, the control terminals 64 extend toward the control board 40, while the power terminals 65 extend toward the power board 70.

Each of the control terminals 64 is inserted into the respective through-holes 43 of the control board 40 and electrically connected thereto by soldering or the like. Control signals are transmitted through the control terminals 64 from the control board 40 to the power modules 60. In a similar manner, each of the power terminals 65 is inserted into respective through-holes 73 (explained below) formed on the power board 70 and electrically connected thereto by soldering or the like. Electric driving currents to be supplied to the windings 26 flow to the power modules 60 through the power terminals 65.

According to the present embodiment, only a small electric current (for example, 2A) flows in the control board 40 for carrying out control of motor operation. On the other hand, a large electric current (for example, 80A) flows in the power board 70 for driving the electric motor 2. Therefore, the power terminals 65 are made larger than the control terminals 64.

A control ground terminal 66 is made to be equal in size to the control terminals 64. The control ground terminal 66 extends through the molded portion 61 so that the control ground terminal 66 is connected to a ground portion (not shown) of the power board 70. A ground portion (not shown) of the control board 40 is also grounded to the earth via the control ground terminal 66.

The power module 60 has the MOS transistors 81 to 86, which are switching elements for controlling power supply of the electric current to the windings 26. Wiring patterns (not shown) made of copper or copper alloy plates are provided in the power module 60. The MOS transistors 81 to 88 (the switching elements and power source relays) as well as the shunt resisters 107 to 109 are mounted on the wiring patterns so that they are electrically connected to each other. Those wiring patterns as well as the electronic parts are molded together to form the molded portion 61. The driving apparatus 1 has two power modules 60 respectively forming the inverters 80 and 89 (FIG. 1).

A relationship between the power modules 60 and the circuit structure of FIG. 1 will be explained. One of the power modules 60 corresponds to the inverter 80 including the MOS transistors 81 to 86, the power-source relays 87 and 88, and the shunt resisters 107 to 109. Namely, the MOS transistors 81 to 86, the power-source relays 87 to 88, and the shunt resisters 107 to 109 are integrally molded to form one of the molded portions 61. The other power module 60 corresponds to the inverter 89, which likewise includes MOS transistors, power-source relays and shunt resisters. As above, one power module corresponds to one inverter, and each of the power modules 60 is respectively attached to the respective heat radiating blocks 51.

A heat radiating sheet (not shown) is provided between the power module 60 and the heat sink 50. The power module 60 is fixed to the heat sink 50 by screws or bolts 69 together with the heat radiating sheet. Heat generated at the power module 60, when electric power is supplied thereto, is transmitted to the heat sink 50 via the heat radiating sheet. Although not shown in the drawings, a part of the wiring patterns is exposed to the outside of the molded portion 61, as a heat radiating metal portion, on a side of the power module 60 to the heat sink 50. This heat radiating metal portion is brought into contact with the heat sink 50 via the heat radiating sheet, so that the heat generated at the power module 60 is effectively transmitted to the heat sink 50. The heat radiating sheet not only transmits the heat from the power module 60 to the heat sink 50 but also provides an electrical insulation between the power module 60 and the heat sink 50.

The power board 70 is made of, for example, a four-layered board of glass-epoxy boards, wherein copper leaf is formed. The power board 70 is formed in an almost square shape, so that the power board 70 is accommodated in the virtual motor casing space. Notched portions 71 are formed at four corners of the power board 70, so that spaces for accommodating the fixing portions 54 and 55 of the heat sink 50 are obtained. The power board 70 is fixed to the heat sink 50 by screws or bolts 72 from a side opposite to the electric motor 2.

Power wiring patterns (not shown) are provided in the power board 70, through which the electric current to the windings 26 flows. The power wiring patterns correspond to the wirings indicated by two-dot-chain lines in FIG. 19.

Figure 11:
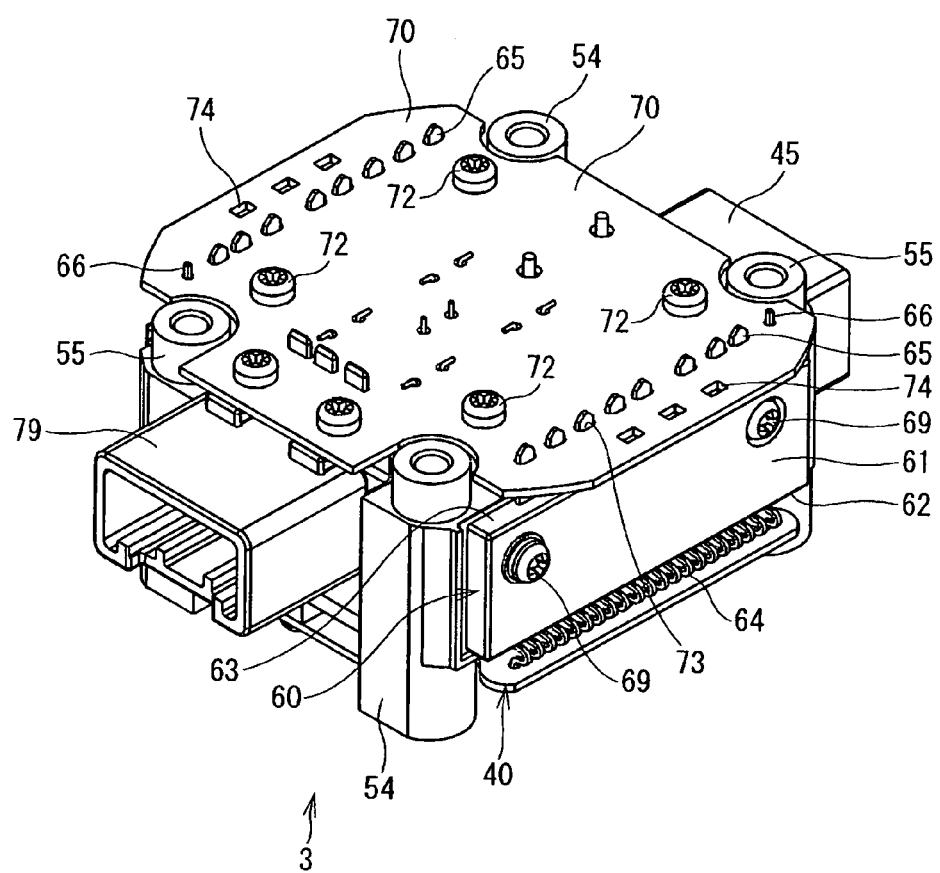
FIG. 11 is a schematic perspective view showing the controller of the first embodiment.

As shown in FIG. 11, the multiple through-holes 73, into which the power terminals 65 of the power modules 60 are inserted, are formed in the power board 70. Multiple through-holes 74 are likewise formed in the power board 70 at outer sides of the through-holes 73, so that the stator coil terminals 27 are inserted into the respective through-holes 74. The stator coil terminals 27 are electrically connected to the power board 70 by soldering or the like. As a result, the stator coil terminals 27 are connected to the power module 60s via the power board 70.

The choke coil 76, the capacitors 77 and 78, and a power connector 79 are mounted on the power board 70 on the side to the electric motor 2, to thereby form the power unit 105. The power unit 105 and the power modules 60 form the power portion 100.

A layout of the power unit 105 will be explained with reference to FIGS. 16 to 18. The power unit 105 (including the choke coil 76, the capacitors 77 and 78, and the power connector 79) is arranged in a space formed between the pair of the heat radiating blocks 51. The power unit 105 is further arranged in the axial direction between the connecting portion 52 of the heat sink 50 and the power board 70. Those electronic parts (the choke coil 76, the capacitors 77 and 78, and the power connector 79) are linearly arranged in this order from a side of the control connector 45 connected to the control board 40.

The choke coil 76 is formed in a cylindrical shape, wherein an axial length thereof is smaller than a radial length (a diameter). The choke coil 76 is located at a position, which does not overlap the rotating shaft 35 when viewed in the axial direction of the electric motor 2. Further, the choke coil 76 is so arranged that an axial center line thereof is almost at a right angle to the axis of the electric motor 2.

The capacitor 77 is located at a center among the other four capacitors 78, which are arranged adjacently to each other. The capacitors 77 and 78 are made of aluminum electrolytic capacitors. The capacitor 78 has a larger electric capacity than the capacitor 77. The capacitors 77 and 78 may be made of other type capacitors depending on the electric capacity.

The power connector 79 is provided at a side opposite to the control connector 45 connected to the control board 40. Multiple external terminals (not shown) are connected to the power connector 79 in a radial direction of the electric motor 2, so that the power board 70 is connected to the power source 75. Therefore, the electric power is supplied from the power source 75 to the power board 70 via the power connector 79. In addition, the electric power from the power source 75 is supplied to the windings 26 wound on the stator 20 via the power connector 79, the power board 70, the power modules 60, and the stator coil terminals 27.

The controller 3 is accommodated in the inside of the motor cover 110 (FIG. 5 or 6). The motor cover 110 is made of magnetic material, such as iron, so that it prevents the electric field and/or magnetic field from leaking to the outside. The motor cover 110 further prevents dust from entering into the inside thereof. The motor cover 110 is formed in a cylindrical shape, which has a closed end at one side and an open end at the other side toward the electric motor 2. The open end of the motor cover 110 has a diameter almost equal to that of the motor casing 10. The motor cover 110 is fixed to the motor casing 10 by the bolts 57 together with the heat sink 50. Notched portions 111 are formed in the motor cover 110 at such portions corresponding to the control connector 45 and the power connector 79, so that each of the connectors 45 and 79 exposed to the outside of the motor cover 110 through the notched portions 111 in the radial direction of the electric motor 2. A pair of projecting wall portions 18 is formed in the guide member 16 at such portions respectively corresponding to the notched portions for the connectors 45 and 79. Stepped portions 19 are formed at the projecting wall portions 18, so that the motor cover 110 is firmly positioned to the motor casing 10.

An operation of the driving apparatus 1 will be explained. The micro-computer 94 mounted on the control board 40 generates pulse signals through the pre-driver circuits 91 by a PWM control process, based on the signals from the position sensor 93, the torque sensor 8, the shunt resisters 107 to 109 and so on, in order to assist a steering operation of the steering wheel 5 depending on the vehicle speed.

The pulse signals are outputted to the respective inverters 80 and 89 of the two systems having the power modules 60, via the control terminals 64, so that the MOS transistors 81 to 86 are switched on and off. As a result, sinusoidal currents having different phases are supplied to the respective phase coils of the windings 26, to thereby generate a rotating magnetic field. The rotor 30 as well as the rotating shaft 35 is rotated upon receiving the rotating magnetic field. A driving force is outputted from the output portion 37 to the gear 7 of the column shaft 6 by the rotation of the rotating shaft 35, so as to assist the steering operation of the steering wheel 5 by the vehicle driver.

The heat, which is generated when switching on and off the MOS transistors 81 to 88 of the power module 60, is radiated to the heat sink 50 via the heat radiating sheets in order to prevent any malfunction and/or breakdown of the power module 60 due to its temperature increase.

It is possible to optionally set the size of the stator 20 and the rotor 30 depending on the required output.

Figure 20:
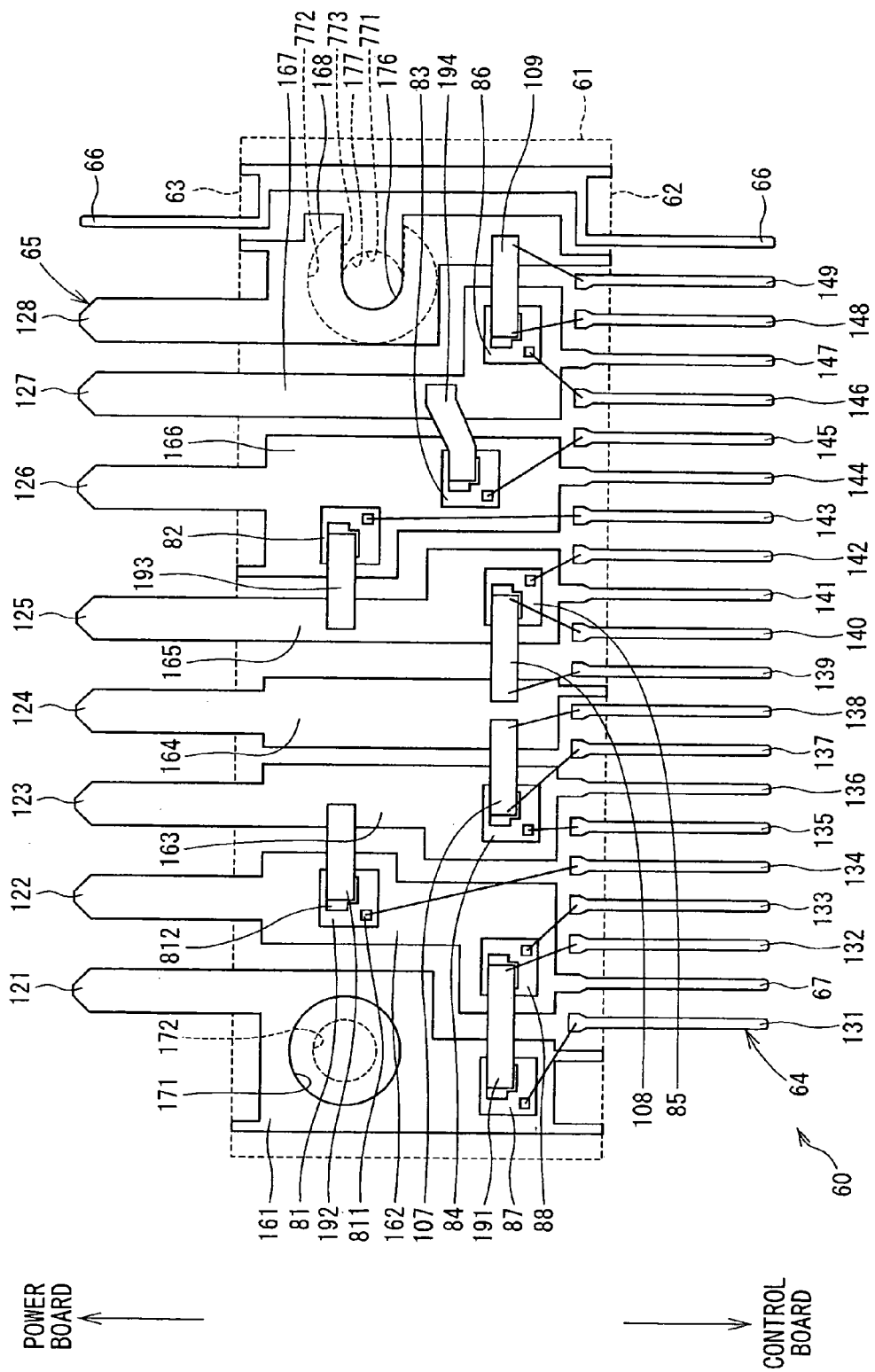
FIG. 20 is a schematic view showing an inside structure of a semiconductor module device of the first embodiment.

An inside structure of the power module 60 will be explained with reference to FIG. 20. In FIG. 20, an upper side of the drawing corresponds to the side of the power board 70, while a lower side corresponds to the side of the control board 40. Since the power modules 60 are the same to each other, the inside structure of the power module 60 corresponding to the inverter 80 will be explained.

As shown in FIG. 20, the wiring patterns of the copper or the copper alloy are formed in the power module 60 and the MOS transistors 81 to 88 of the switching elements and the power-source relays are mounted thereon. A semiconductor chip for the MOS transistor 81 will be explained. A reference numeral 811 designates a gate, while a reference numeral 812 designates a source. A drain of the MOS transistor 81 is formed on a back side of the semiconductor chip. The other MOS transistors 82 to 88 have the same structure to that of the MOS transistor 81.

The power module 60 has multiple terminals, which are arranged in longitudinal direction of the molded portion 61 and projecting outwardly from both sides (the first and second surfaces 62 and 63) of the molded portion 61. The control ground terminal 66, a control power input terminal 67 and control terminals 131 to 149 are provided at the first surface 62, which is opposed to (facing to) the control board 40. The control terminals 131 to 149 correspond to and are collectively referred to as the control terminals 64.

A power-source input terminal 121, an inverter input terminal 122, a U-phase coil terminal 123, an inverter ground terminal 124, a V-phase coil terminal 125, an inverter input terminal 126, a W-phase coil terminal 127, an inerter ground terminal 128 and the control ground terminal 66 are arranged in this order in the longitudinal direction of the molded portion 61 and extending from the second surface 63 of the molded portion 61. The power-source input terminal 121, the inverter input terminals 122 an 126, the coil terminals 123, 125 and 127, and the inverter ground terminals 124 and 128 correspond to and are collectively referred to as the power terminals 65.

Relationships of electrical connections for the control terminals 64, the power terminals 65, the control ground terminal 66, the control power input terminal 67, and the MOS transistors 81 to 88 are explained.

The power-source input terminal 121 is integrally formed with a land 161, on which the power-source relay 87 is mounted. A gate of the power-source relay 87 is connected to the control terminal 131. A switching operation (turn-on and turn-off) of the power-source relay 87 is controlled by changing a gate voltage of the power-source relay 87 via the control terminal 131. A source of the power-source relay 87 is connected to a source of the other power-source relay 88 via a wiring member 191, which is connected to the control terminal 132 in order to output a voltage signal applied to a point between the power-source relays 87 and 88 to the control board 40. The voltage signal is used for detecting malfunction of the driving apparatus 1.

Figure 13:
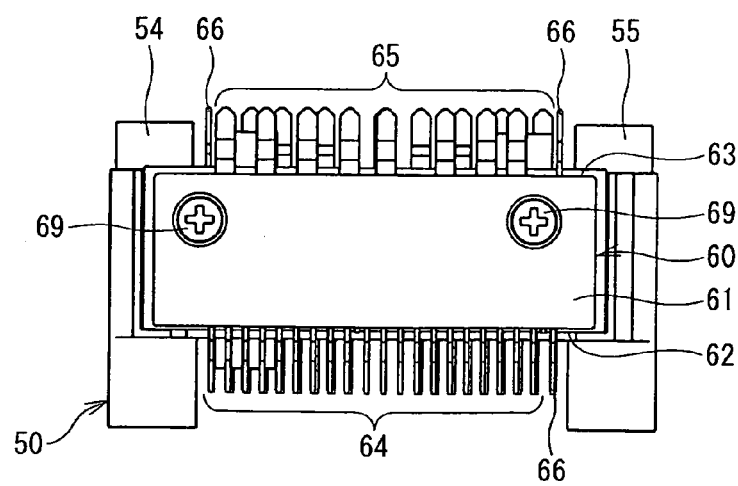
FIG. 13 is a schematic side view of the heat sink with the power module when viewed in a direction of an arrow XIII in FIG. 12.

A hole 171 is formed in the land 161. The hole 171 is formed in a circular shape, a diameter of which is larger than that of a hole 172 formed in the molded portion 61. The bolt 69 is inserted into the holes 171 and 172 (FIGS. 12 and 13).

The inverter input terminal 122 is integrally formed with a land 162 and the control power input terminal 67. The control power input terminal 67 supplies electric power, which is transmitted from the power-source input terminal 121 through the power-source relays 87 and 88, to the control board 40. The power-source relay 88 and the U-phase upper side MOS transistor 81 are mounted on the land 162. A gate of the power-source relay 88 is connected to the control terminal 133. A switching operation (turn-on and turn-off) of the power-source relay 88 is controlled by changing a gate voltage of the power-source relay 88 via the control terminal 133.

The U-phase upper side MOS transistor 81 is mounted on the land 162 at a position, which is closer to the power board 70 and to the U-phase coil terminal 123 with respect to the power-source relay 88, in other words, at a position above and a right-hand side of the power-source relay 88 in the drawing of FIG. 20. A gate of the U-phase upper side MOS transistor 81 is connected to the control terminal 134. A switching operation of the U-phase upper side MOS transistor 81 is controlled by changing a gate voltage thereof via the control terminal 134. A source of the U-phase upper side MOS transistor 81 is connected to a land 163 via a wiring member 192. The land 163 is integrally formed with the U-phase coil terminal 123.

The U-phase coil terminal 123 is integrally formed with the land 163 and the control terminal 136. The control terminal 136 outputs a voltage signal applied to a point between the U-phase upper side MOS transistor 81 and the U-phase lower side MOS transistor 84 to the control board 40.

The U-phase lower side MOS transistor 84 is mounted on the land 163 at such a position, which is closer to the control board 40 with respect to the wiring member 192 connecting the source of the U-phase upper side MOS transistor 81 to the land 163. In other words, the U-phase lower side MOS transistor 84 is located at a position closer to the control board 40 than the U-phase upper side MOS transistor 81. A gate of the U-phase lower side MOS transistor 84 is connected to the control terminal 135. A switching operation of the U-phase lower side MOS transistor 84 is controlled by changing a gate voltage thereof via the control terminal 135.

The inverter ground terminal 124 is integrally formed with a land 164, which is connected to a source of the U-phase lower side MOS transistor 84 via the shunt resister 107. The shunt resister 107 is connected to the control terminal 137 on a side of the U-phase lower side MOS transistor 84, while it is also connected to the control terminal 138 on a side of the land 164, so that a voltage signal applied to the shunt resister 107 is outputted to the control board 40. A current supplied to the U-phase coil is thereby detected based on the voltage signal.

The land 164 is further connected to a source of the V-phase lower side MOS transistor 85 via the shunt resister 108. The shunt resister 108 is connected to the control terminal 139 on a side of the land 164, while it is connected to the control terminal 140 on a side of the V-phase lower side MOS transistor 85, so that a voltage signal applied to the shunt resister 108 is outputted to the control board 40. A current supplied to the V-phase coil is thereby detected based on the voltage signal.

The V-phase coil terminal 125 is integrally formed with a land 165 and the control terminal 141. The control terminal 141 outputs a voltage signal applied to a point between the V-phase upper side MOS transistor 82 and the V-phase lower side MOS transistor 85 to the control board 40. The V-phase lower side MOS transistor 85 is mounted on the land 165 at such a position, which is closer to the control board 40 with respect to a wiring member 193 connecting the V-phase upper side MOS transistor 82 to the land 165. In other words, the V-phase lower side MOS transistor 85 is located at a position closer to the control board 40 than the V-phase upper side MOS transistor 82. A gate of the V-phase lower side MOS transistor 85 is connected to the control terminal 142. A switching operation of the V-phase lower side MOS transistor 85 is controlled by changing a gate voltage thereof via the control terminal 142.

The inverter input terminal 126 is integrally formed with a land 166 and the control terminal 144. The control terminal 144 outputs a voltage signal, which is related to a relay voltage applied to a downstream side of the power-source relays 87 and 88, to the control board 40.

The V-phase upper side MOS transistor 82 is mounted on the land 166. A source of the V-phase upper side MOS transistor 82 is connected to the land 165 via the wiring member 193. A gate of the V-phase upper side MOS transistor 82 is connected to the control terminal 143. A switching operation of the V-phase upper side MOS transistor 82 is controlled by changing a gate voltage thereof via the control terminal 143.

The W-phase upper side MOS transistor 83 is mounted on the land 166. The V-phase upper side MOS transistor 82 is mounted on the land 166 at a position closer to the land 165 integrally formed with the V-phase coil terminal 125, while the W-phase upper side MOS transistor 83 is mounted on the same land 166 at a position closer to a land 167 integrally formed with the W-phase coil terminal 127. The W-phase upper side MOS transistor 83 is located on the land 166 closer to the control board 40 than the V-phase upper side MOS transistor 82. A gate of the W-phase upper side MOS transistor 83 is connected to the control terminal 145. A switching operation of the W-phase upper side MOS transistor 83 is controlled by changing a gate voltage thereof via the control terminal 145. A source of the W-phase upper side MOS transistor 83 is connected to the land 167, which is integrally formed with the W-phase coil terminal 127, via a wiring member 194.

The W-phase coil terminal 127 is integrally formed with the land 167 and the control terminal 147. The control terminal 147 outputs a voltage signal applied to a point between the W-phase upper side MOS transistor 83 and the W-phase lower side MOS transistor 86 to the control board 40.

The W-phase lower side MOS transistor 86 is mounted on the land 167 at such a position, which is closer to the control board 40 than the wiring member 194 connecting a source of the W-phase upper side MOS transistor 83 to the land 167. In other words, the W-phase lower side MOS transistor 86 is located closer to the control board 40 than the W-phase upper side MOS transistor 83. A gate of the W-phase lower side MOS transistor 86 is connected to the control terminal 146. A switching operation of the W-phase lower side MOS transistor 86 is controlled by changing a gate voltage thereof via the control terminal 146.

The inverter ground terminal 128 is integrally formed with a land 168, which is connected to a source of the W-phase lower side MOS transistor 86 via the shunt resister 109. The shunt resister 109 is connected to the control terminal 148 on a side of the W-phase lower side MOS transistor 86, while it is also connected to the control terminal 149 on a side of the land 168, so that a voltage signal applied to the shunt resister 109 is outputted to the control board 40. A current supplied to the W-phase coil is thereby detected based on the voltage signal.

A U-shaped hole 176, which is opened toward the control ground terminal 66, is formed in the land 168. A hole 177 is formed in the molded portion 61 at a position corresponding to the U-shaped hole 176. The hole 177 has a small arc portion 771 opening to a side opposite to the control ground terminal 66, a large arc portion (a C-shaped portion) 772 opening to the side of the control ground terminal 66, and straight portions 773 connecting the small arc portion 771 and the large arc portion 772. A closed end of the U-shaped hole 176 has the same diameter to that of the small arc portion 771. The bolt 69 is inserted into the U-shaped hole 176 and the small arc portion 771 (FIGS. 12 and 13).

It may be modified that the land 168 is electrically connected to the heat sink 50, namely grounded to the earth, by the bolt 69 inserted into the U-shaped hole 176 and the hole 177. In this meaning, the bolt 69 can be regarded as a grounding member.

The control ground terminal 66 is separately provided from the inverter ground terminals 124 and 128. The control ground terminal 66 is provided in the molded portion 61 in such a manner that the control ground terminal 66 extends through the molded portion 61 at a longitudinal end portion opposite to the power-source input terminal 121 so as to connect the ground portion of the power board 70 to the control board 40. As a result, the control board 40 is grounded via the control ground terminal 66.

As above, the upper side MOS transistors 81 to 83 are relatively located at the side closer to the power board 70, while the lower side MOS transistors 84 to 86 as well as the power-source relays 87 and 88 are relatively located at the side closer to the control board 40. In addition, the shunt resisters 107 to 109 connected between the lower side MOS transistors 84 to 86 and the ground are relatively located at the side closer to the control board 40. Furthermore, the control terminals 137 to 140, 147 and 148 for outputting the detected values by the shunt resisters 107 to 109 as well as wirings for connecting the control terminals 137 to 140, 147 and 148 to the shunt resisters 107 to 109 are relatively located at the side closer to the control board 40.

The control terminals 137 to 140, 147 and 148 as well as the wirings for connecting the control terminals 137 to 140, 147 and 148 to the shunt resisters 107 to 109 correspond to and collectively referred to as "current detecting wirings".

A width (a length in the longitudinal direction of the power module 60) of the land 161 on the side closer to the power board 70 is made larger than a width of the same land 161 on the side closer to the control board 40. On the other hand, a width of the land 162 neighboring to the land 161 on the side to the power board 70 is made smaller than that of the same land 162 on the side closer to the control board 40. In most of the lands 161 to 167, except for the land 164, the widths of the neighboring lands are alternately made larger and smaller, so that a space in the longitudinal direction (left-and-right direction in the drawing of FIG. 20) of the power module 60 can be effectively used. The power module 60 is thereby made smaller in size.

Relationships of electrical connections for the power terminals 65 will be explained.

The power-source input terminal 121 is connected to the power source 75 via the power board 70 and the power connector 79. The power-source input terminal 121 is connected to the inverter input terminal 122 via the land 161, the power-source relay 87, the wiring member 191, the power-source relay 88 and the land 162. According to such a structure, when the power-source relays 87 and 88 are turned on, the electric power from the power source 75 supplied to the power-source input terminal 121 and outputted from the inverter input terminal 122.

The inverter input terminal 122 is connected to the inverter input terminal 126 via the power board 70, so that the electric power supplied to the inverter input terminal 122 is supplied to the inverter input terminal 126 via the power board 70. The inverter input terminals 122 and 126 are connected to the capacitors 78 via the power board 70. According to such a structure, the electric power charged at the capacitors 78 is supplied to the inverter input terminals 122 and 126 via the power board 70. Therefore, the power source 75 as well as the capacitors 78 corresponds to and are collectively referred to as "an electric power storing portion" or "a power source portion".

The inverter ground terminal 124 is connected to the inverter ground terminal 128 via the power board 70. The inverter ground terminals 124 and 128 are connected to the ground portion of the power board 70.

The U-phase coil terminal 123 is connected to the U-phase coil via the power board 70. The inverter input terminal 122 and the inverter ground terminal 124 are provided at both sides of the U-phase coil terminal 123. The U-phase coil terminal 123 and the inverter input terminal 122 are connected to each other via the wiring member 192, while the U-phase coil terminal 123 and the inverter ground terminal 124 are connected to each other via the shunt resister 107. As above, the inverter input terminal 122, the U-phase coil terminal 123 and the inverter ground terminal 124 form a terminal group for power supply to the U-phase coil (hereinafter, also referred to as a U-phase terminal group).

The V-phase coil terminal 125 is connected to the V-phase coil via the power board 70. The inverter ground terminal 124 and the inverter input terminal 126 are provided at both sides of the V-phase coil terminal 125. The V-phase coil terminal 125 and the inverter ground terminal 124 are connected to each other via the shunt resister 108, while the V-phase coil terminal 125 and the inverter input terminal 126 are connected to each other via the wiring member 193. As above, the inverter ground terminal 124, the V-phase coil terminal 125 and the inverter input terminal 126 form a terminal group for power supply to the V-phase coil (hereinafter, also referred to as a V-phase terminal group).

The W-phase coil terminal 127 is connected to the W-phase coil via the power board 70. The inverter input terminal 126 and the inverter ground terminal 128 are provided at both sides of the W-phase coil terminal 127. The W-phase coil terminal 127 and the inverter input terminal 126 are connected to each other via the wiring member 194, while the W-phase coil terminal 127 and the inverter ground terminal 128 are connected to each other via the shunt resister 109. As above, the inverter input terminal 126, the W-phase coil terminal 127 and the inverter ground terminal 128 form a terminal group for power supply to the W-phase coil (hereinafter, also referred to as a W-phase terminal group).

In the U-phase terminal group, the inverter input terminal 122, the U-phase coil terminal 123 and the inverter ground terminal 124 are arranged in this order from the power-source input terminal 121. In a similar manner, in the W-phase terminal group, the inverter input terminal 126, the W-phase coil terminal 127 and the inverter ground terminal 128 are arranged in this order from the power-source input terminal 121. However, in the V-phase terminal group, the inverter ground terminal 124, the V-phase coil terminal 125 and the inverter input terminal 126 are arranged in this order from the power-source input terminal 121. Namely, an alignment of the respective terminals in the V-phase terminal group is reversed from an alignment of the respective terminals in the U-phase terminal group and the W-phase terminal group.

The inverter ground terminal 124 corresponds to not only the inverter ground terminal of the U-phase terminal group but also the inverter ground terminal of the V-phase terminal group. In other words, the inverter ground terminal 124 of the U-phase terminal group is integrally formed with the inverter ground terminal 124 of the V-phase terminal group. It can be further regarded that the inverter ground terminal 124 is commonly used for the U-phase terminal group and the V-phase terminal group.

The inverter input terminal 126 corresponds to not only the inverter input terminal of the V-phase terminal group but also the inverter input terminal of the W-phase terminal group. In other words, the inverter input terminal 126 of the V-phase terminal group is integrally formed with the inverter input terminal 126 of the W-phase terminal group. It can be further regarded that the inverter input terminal 126 is commonly used for the V-phase terminal group and the W-phase terminal group.

The U-phase terminal group, which includes the inverter input terminal 122, the U-phase coil terminal 123 and the inverter ground terminal 124, is also referred to as "a first terminal group". In a similar manner, the V-phase terminal group, which includes the inverter ground terminal 124, the V-phase coil terminal 125 and the inverter input terminal 126, is also referred to as "a second terminal group". And the W-phase terminal group, which includes the inverter input terminal 126, the W-phase coil terminal 127 and the inverter ground terminal 128, is also referred to as "a third terminal group".

Power supply path for the power module 60 will be explained.

The power-source relay 87 for cutting off the power supply as well as the power-source relay 88 for preventing reverse flow is controlled so that the electric power is supplied to the driving apparatus 1 when there is no malfunction in an electrical system of the driving apparatus 1.

When the power-source relays 87 and 88 are turned on, the electric power inputted from the power-source input terminal 121 is supplied to the inverter input terminal 122 through the land 161, the power-source relay 87, the wiring member 191, the power-source relay 88 and the land 162. The electric power supplied to the inverter input terminal 122 is further supplied to the inverter input terminal 126 and the capacitors 78 via the power board 70. A flow direction of the electric current in the inverter input terminal 122 is opposite to that in the power-source input terminal 121.

In addition, the electric power inputted from the power-source input terminal 121 is supplied to the control power input terminal 67 through the land 161, the power-source relay 87, the wiring member 191, the power-source relay 88 and the land 162. Therefore, the control power input terminal 67 is a branch terminal for branching out a part of the electric power from the power-source input terminal 121 to the control board 40.

Power supply path for the electric motor 2 will be explained. When the electric motor 2 is in its operation, one of the upper side and lower side MOS transistors (forming the pair of transistors) is turned on, while the other MOS transistor is turned off.

At first, when the U-phase upper side MOS transistor 81 is turned on, then at least one of the V-phase lower side MOS transistor 85 and the W-phase lower side MOS transistor 86 is turned on.

To the drain of the U-phase upper side MOS transistor 81, the electric power from the power-source input terminal 121 as well as the electric power from the capacitors 78 via the inverter input terminal 122 is supplied. When the U-phase upper side MOS transistor 81 is turned on, the electric power supplied to the drain of the U-phase upper side MOS transistor 81 is supplied to the U-phase coil via the wiring member 192, the land 163 and the U-phase coil terminal 123.

In a case that the V-phase lower side MOS transistor 85 is turned on, the electric power supplied to the U-phase coil is supplied to the V-phase coil terminal 125 via the V-phase coil, and then grounded to the ground portion of the power board 70 via the land 165, the V-phase lower side MOS transistor 85, the shunt resister 108, the land 164 and the inverter ground terminal 124.

On the other hand, in a case that the W-phase lower side MOS transistor 86 is turned on, the electric power supplied to the U-phase coil is supplied to the W-phase coil terminal 127 via the W-phase coil, and then grounded to the ground portion of the power board 70 via the land 167, the W-phase lower side MOS transistor 86, the shunt resister 109, the land 168 and the inverter ground terminal 128.

In the above operational mode, a flow direction of the electric current in the U-phase coil terminal 123 is opposite to that in the inverter input terminal 122, a flow direction of the electric current in the V-phase coil terminal 125 is opposite to that in the inverter ground terminal 124, and a flow direction of the electric current in the W-phase coil terminal 127 is opposite to that in the inverter ground terminal 128.

Secondly, when the V-phase upper side MOS transistor 82 is turned on, then at least one of the U-phase lower side MOS transistor 84 and the W-phase lower side MOS transistor 86 is turned on.

To the drain of the V-phase upper side MOS transistor 82, the electric power from the power-source input terminal. 121 as well as the electric power from the capacitors 78 is supplied via the inverter input terminal 126 and the land 166. When the V-phase upper side MOS transistor 82 is turned on, the electric power supplied to the drain of the V-phase upper side MOS transistor 82 is supplied to the V-phase coil via the wiring member 193, the land 165 and the V-phase coil terminal 125.

In a case that the U-phase lower side MOS transistor 84 is turned on, the electric power supplied to the V-phase coil is supplied to the U-phase coil terminal 123 via the U-phase coil, and then grounded to the ground portion of the power board 70 via the land 163, the U-phase lower side MOS transistor 84, the shunt resister 107, the land 164 and the inverter ground terminal 124.

On the other hand, in a case that the W-phase lower side MOS transistor 86 is turned on, the electric power supplied to the V-phase coil is supplied to the W-phase coil terminal 127 via the W-phase coil, and then grounded to the ground portion of the power board 70 via the land. 167, the W-phase lower side MOS transistor 86, the shunt resister 109, the land 168 and the inverter ground terminal 128.

In the above operational mode, a flow direction of the electric current in the V-phase coil terminal 125 is opposite to that in the inverter input terminal 126, a flow direction of the electric current in the U-phase coil terminal 123 is opposite to that in the inverter ground terminal 124, and a flow direction of the electric current in the W-phase coil terminal 127 is opposite to that in the inverter ground terminal 128.

Thirdly, when the W-phase upper side MOS transistor 83 is turned on, then at least one of the U-phase lower side MOS transistor 84 and the V-phase lower side MOS transistor 85 is turned on.

To the drain of the W-phase upper side MOS transistor 83, the electric power from the power-source input terminal 121 as well as the electric power from the capacitors 78 is supplied via the inverter input terminal 126 and the land 166. When the W-phase upper side MOS transistor 83 is turned on, the electric power supplied to the drain of the W-phase upper side MOS transistor 83 is supplied to the W-phase coil via the wiring member 194, the land 167 and the W-phase coil terminal 127.

In a case that the U-phase lower side MOS transistor 84 is turned on, the electric power supplied to the W-phase coil is supplied to the U-phase coil terminal 123 via the U-phase coil, and then grounded to the ground portion of the power board 70 via the land 163, the U-phase lower side MOS transistor 84, the shunt resister 107, the land 164 and the inverter ground terminal 124.

On the other hand, in a case that the V-phase lower side MOS transistor 85 is turned on, the electric power supplied to the W-phase coil is supplied to the V-phase coil terminal 125 via the V-phase coil, and then grounded to the ground portion of the power board 70 via the land 165, the V-phase lower side MOS transistor 85, the shunt resister 108, the land 164 and the inverter ground terminal 124.

In the above operational mode, a flow direction of the electric current in the W-phase coil terminal 127 is opposite to that in the inverter input terminal 126, a flow direction of the electric current in the U-phase coil terminal 123 is opposite to that in the inverter ground terminal 124, and a flow direction of the electric current in the V-phase coil terminal 125 is opposite to that in the inverter ground terminal 124.

As above, the current flow directions in the neighboring terminals are opposite to each other, parasitic inductance can be reduced.

As explained above, the shunt resisters 107 to 109 are arranged at the side relatively closer to the control board 40. The shunt resisters 107 to 109 correspond to such portions or areas (which are also referred to as large-current flowing areas or coil-current flowing areas), through which the electric current for the respective phase coils flows. The control terminals 137 to 140, 148 and 149 as well as the wiring portions between the control terminals and the shunt resisters correspond to current-detecting wiring portions and are arranged at locations closer to the control board 40 than the shunt resisters 107 to 109 (the large-current flowing areas). According to such a structure, an influence by large electric current flowing through the phase coils of the windings 26 may be reduced when detecting the electric current flowing through the shunt resisters 107 to 109.

Effects and advantages of the power module 60 will be explained.

(1) The MOS transistors 81 to 86, the inverter input terminals 122, 126, the coil terminals 123, 125, 127, the inverter ground terminals 124, 128, the control power input terminals 67 and the control ground terminal 66 are integrally molded as the molded portion 61. The control board 40 and the power board 70 are provided separately from each other. The electrical connection between the control board 40 and the power board 70 are realized by the terminals integrally molded in the molded portion 61. It is, therefore, not necessary to provide jumper wirings. Not only a number of parts and components can be reduced but also a number manufacturing processes can be decreased.

(2) The control power input terminal 67, through which the electric power is supplied from the power board 70 to the control board 40, as well as the control ground terminal (66), which connects the ground portions of the power board 70 and the control board 40, 66 are integrally molded in the molded portion 61. It is, therefore, sufficient to electrically connect the power board 70 to the power source 75. It is possible to remove such a member, which would directly and electrically connect the control board 40 to the power source 75. As a result, the structure of the power module can be simplified.

(3) The electrical connection between the inverter input terminals 122 and 126 as well as the electrical connection between the inverter ground terminals 124 and 128 are realized on the side of the power board 70. It is, therefore, not necessary to provide electrical wiring portions between the inverter input terminals as well as between the inverter ground terminals on the side of the power module 60. As a result, the power module 60 can be made smaller in size.

(4) The power board 70 through which the large electric current flows is separated from the control board 40, for which it is not necessary to supply the large electric current. In other words, the large electric current (the power current) flows through the power terminals 65 provided on the side facing to the power board 70, while the control current (which is smaller than the power current) flows through the control terminals 64 provided on the opposite side facing to the control board 40. It is, therefore, possible to adequately design the sizes of the power terminals 65 and the control terminals 64 depending on the respective electric current flowing therethrough.

(5) The control ground terminal 66 is separately provided from the inverter ground terminals 124 and 128. It is, therefore, possible to reduce influences caused by noises, which would be generated when the large electric current flows through the power board 70.

(6) According to the power module 60, the U-phase terminal group is composed of the inverter input terminal 122, the U-phase coil terminal 123 and the inverter ground terminal 124, which are arranged in this order from the power-source input terminal 121. The V-phase terminal group is composed of the inverter input terminal 126, the V-phase coil terminal 125 and the inverter ground terminal 124, which are arranged in this order from the control ground terminal 66. In addition, the W-phase terminal group is composed of the inverter input terminal 126, the W-phase coil terminal 127 and the inverter ground terminal 128, which are arranged in this order from the power-source input terminal 121.

For example, when the U-phase upper side MOS transistor 81 is turned on, the electric current flows from the inverter input terminal 122 to the U-phase coil terminal 123 via the U-phase upper side MOS transistor 81. The inverter input terminal 122 and the U-phase coil terminal 123 are arranged neighboring to each other on the side of the molded portion 61 facing to the power board 70. The current flow directions in the inverter input terminal 122 and the U-phase coil terminal 123 are opposite to each other. In the similar manner, when the V-phase upper side MOS transistor 82 is turned on, the current flow directions in the inverter input terminal 126 and the V-phase coil terminal 125, which are neighboring to each other, are opposite to each other. Furthermore, when the W-phase upper side MOS transistor 83 is turned on, the current flow directions in the inverter input terminal 126 and the W-phase coil terminal 127, which are neighboring to each other, are opposite to each other. As a result, the inductance in the inverter circuits can be reduced.

In addition, when the U-phase lower side MOS transistor 84 is turned on, the electric current flows from the U-phase coil terminal 123 to the inverter ground terminal 124 via the U-phase lower side MOS transistor 84. The U-phase coil terminal 123 and the inverter ground terminal 124 are arranged neighboring to each other on the side of the molded portion 61 facing to the power board 70. The current flow directions in the U-phase coil terminal 123 and the inverter ground terminal 124 are opposite to each other.

In the similar manner, when the V-phase lower side MOS transistor 85 is turned on, the current flow directions in the V-phase coil terminal 125 and the inverter ground terminal 124, which are neighboring to each other, are opposite to each other. Furthermore, when the W-phase lower side MOS transistor 86 is turned on, the current flow directions in the W-phase coil terminal 127 and the inverter ground terminal 128, which are neighboring to each other, are opposite to each other. As a result, the inductance in the inverter circuits can be reduced.

(7) The windings 26 are composed of the three phase coils and each of the terminal groups corresponds to the respective phase coils. As explained above, the U-phase terminal group is composed of the inverter input terminal 122, the U-phase coil terminal 123 and the inverter ground terminal 124, which are arranged in this order from the power-source input terminal 121. The W-phase terminal group is composed of the inverter input terminal 126, the W-phase coil terminal 127 and the inverter ground terminal 128, which are arranged in this order from the power-source input terminal 121. The V-phase terminal group, which is neighboring to the U-phase terminal group and the W-phase terminal group, is composed of the inverter ground terminal 124, the V-phase coil terminal 125 and the inverter input terminal 126, which are arranged in this order from the power-source input terminal 121.

Alignments of the terminals are opposite to each other between the U-phase terminal group and the V-phase terminal group. Alignments of the terminals are also opposite to each other between the W-phase terminal group and the V-phase terminal group. The U-phase terminal group (the first terminal group) and the W-phase terminal group (the third terminal group), alignments of which are the same to each, and the V-phase terminal group (the second terminal group) are alternately arranged in the longitudinal direction of the molded portion 61.

(8) The inverter ground terminal 124 of the U-phase terminal group and the inverter ground terminal 124 of the V-phase terminal group are formed as a common terminal belonging to both terminal groups. As a result, the power module 60 is made smaller in size. In a similar manner, the inverter input terminal 126 of the V-phase terminal group and the inverter input terminal 126 of the W-phase terminal group are formed as a common terminal belonging to both terminal groups, so as to reduce the power module smaller in size.

(9) The power module 60 has the shunt resisters 107 to 109. The coil terminals 123, 125, 127 are provided on the side facing to the power board 70, while the control terminals 131 to 149 are provided on the side facing to the control board 40, wherein those terminals (123, 125, 127, 131 to 149) are electrically connected in the power module 60. The shunt resisters 107 to 109 are provided between the coil terminals 123, 125, 127 and the control terminals 137 to 140, 148, 149 for the current detection, so that the electric current flowing through the windings 26 can be properly detected and such detected values can be outputted to the control board 40 in a simple structure. In addition, since the shunt resisters 107 to 109 are provided in the power module 60, it is possible to reduce a number of parts and components and thereby decrease the number of assembling processes. Furthermore, the driving apparatus can be made smaller in size, due to the reduced number of the parts and components.

(10) The control terminals 137 to 140, 148 and 149 (which connect the shunt resisters 107 to 109 to the control board 40) as well as the wiring portions between the control terminals 137 to 140, 148 and 149 and the shunt resisters 107 to 109 are arranged at such locations closer to the control board 40 than the coil-current flowing areas through which the current for the phase coils of the windings 26 flows. In other words, the current-detecting wiring portions (including the control terminals and the wiring portions) are located closer to the control board 40 than the coil-current flowing areas (that is, the large-current flowing areas). Therefore, it is possible to reduce the influence by the noise, which may be generated by the large electric current flowing through the large-current flowing areas.

(11) The power module 60 has the power-source relays 87 and 88 for cutting off the power supply to the inverter circuits. Since the power-source relays 87 and 88 are provided in the semiconductor module 60, it is possible to reduce the number of parts and components and also to decrease the number of assembling processes. The driving apparatus 1 can be made smaller in size, when compared with a case in which the power-source relays 87 and 88 are separately provided.

The power module 60 is applied to the driving apparatus 1 having the electric motor 2 and the controller 3 for controlling the operation of the electric motor 2. Effects and advantages of the driving apparatus 1 will be explained.

(12) The power module 60 is arranged in such a manner that it extends in the axial direction of the motor casing 10 from the end surface 13. In other words, a flat plane of the power module 60 is perpendicular to the surface of the end surface 13 of the motor casing 10. As a result, it is possible to effectively use the virtual motor casing space, which is formed at the axial end of the motor casing 10 by projecting the motor casing in the axial direction. A radial size of the driving apparatus 1 can be thereby made smaller.

(13) Since the controller 3 is arranged in the axial direction of the electric motor 2, the size of the driving apparatus in the radial direction can be made smaller. The electric motor 2 and the controller 3 are separately provided in the axial direction, and it is relatively easier to take out the controller 3 from the electric motor 2. Therefore, even in a case that the required output of the electric motor 2 is changed, it is easier to modify a design of the controller 3, for example, by simply changing a heat capacity of the heat sink 50. It is, therefore, possible to manufacture the driving apparatuses 1 having different specifications, when the parts and/or components are standardized. In addition, even when either the electric motor 2 or the controller 3 is broken down, it is easier to repair the apparatus by exchanging only the component (the electric motor 2 or the controller 3) which is broken.

(14) The power board 70, through which the large electric current flows for driving the electric motor 2, and the control board 40, for which the large electric is not necessary, are separated from each other. Therefore, it is possible to make the copper foil of the control board 40 thinner.

(15) The motor casing 10, the control board 40, the heat sink 50 and the power module 60, and the power board 70 are axially arranged in this order. The output portion 37 of the rotating shaft 35 is provided at the axial end of the motor casing 10 opposite to the control board 40. The rotating shaft 35 does not pass through the control board 40. The rotating shaft 35 can be made shorter and vibration thereof can be suppressed. Since the rotating shaft 35 does not pass through the control board 40, an area for the control board 40 can be effectively used. As a result, the driving apparatus can be made smaller in size as a whole.

(16) The stator coil terminals 27 are electrically connected to the power module 60 via the power board 70. In this meaning, the power board 70 is an electrical connecting portion for the stator coil terminals 27 and the power module 60. The stator coil terminals 27 are connected to the power module 60 on the side of the molded portion 61, which is away from the motor casing 10. Since the motor casing 10, the control board 40, the heat sink 50 and the power module 60, and the power board 70 are axially arranged in this order, the electrical connecting portion (the power board 70) is located at the axial end of the driving apparatus 1. Therefore, it is easier to connect the stator coil terminals 27 to the power module 60. It is also easier to repair the driving apparatus 1, when any malfunction occurs in the driving apparatus.

(17) The stator coil terminals 27 are electrically connected to the coil terminals 123, 125 and 127 via the power board 70. Therefore, the electrical connections between the stator coil terminals 27 and the coil terminals 123, 125, 127 as well as the electrical connections between the other power terminals 65 and the power board 70 can be done at one process. The manufacturing processes can be thus simplified.

(18) The heat sink 50 has the pair of the heat radiating blocks 51 separated from each other. It is, therefore, possible to disperse the heat generated at the power modules 60 to the heat radiating blocks 51.

Each of the power modules 60 has one inverter 80 or 89 and one heat radiating block 51. Since the heat generated in each of the power modules 60 is almost equal to each other, the heat is radiated in a balanced manner.

Second to fourth embodiments of the present invention will be explained with reference to FIGS. 21 to 23. Each of the second to fourth embodiments is different from the first embodiment in a structure of the power module, while a structure of the driving apparatus of the second to fourth embodiments is the same as that of the first embodiment. Therefore, the structure of the power module will be explained below.

(Second Embodiment)

Figure 21:
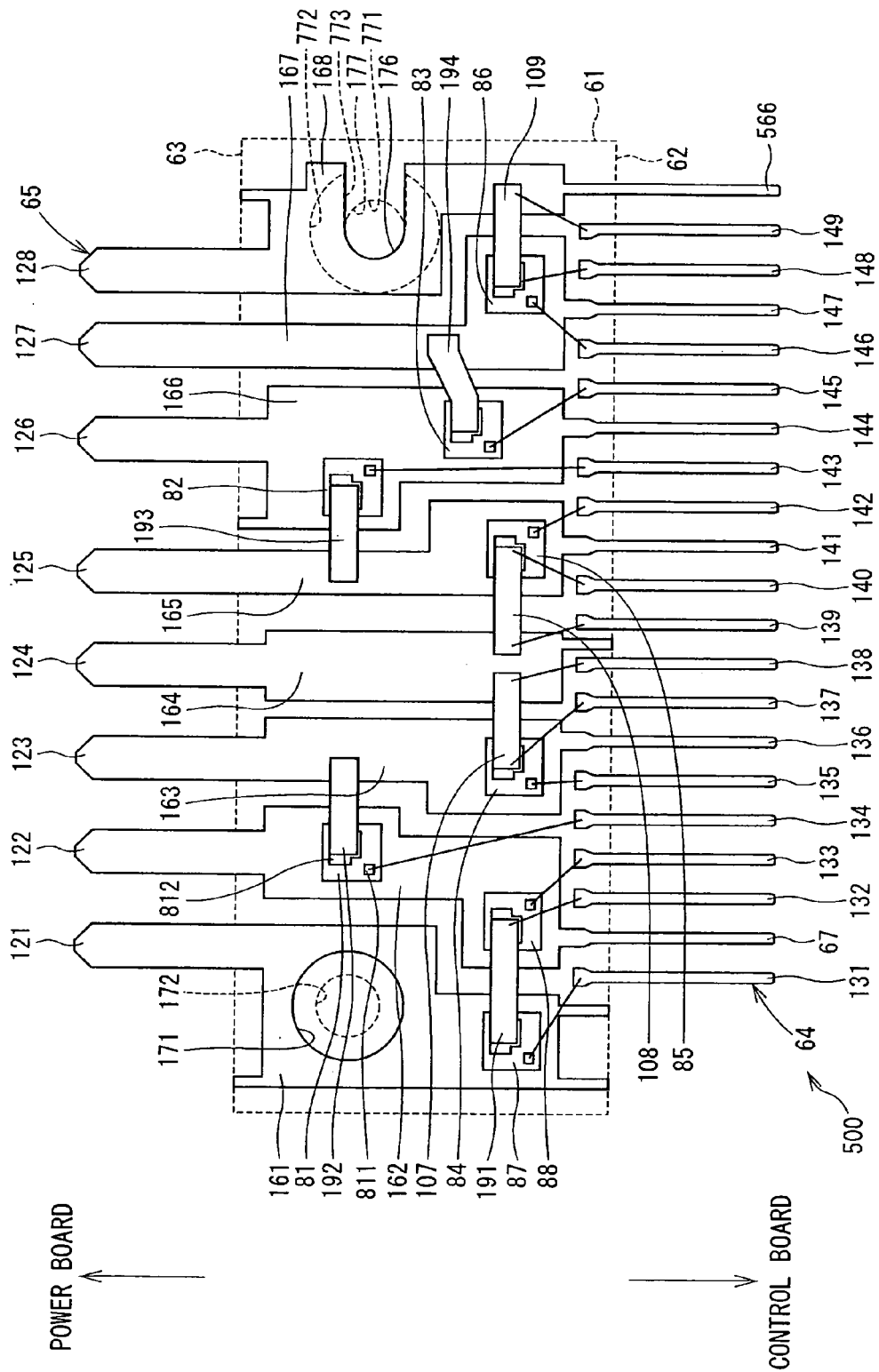
FIG. 21 is a schematic view showing an inside structure of a semiconductor module device of a second embodiment of the present invention.

As shown in FIG. 21, according to the second embodiment, a control ground terminal 566 is integrally formed with the inverter ground terminal 128 and the land 168. The control ground terminal 566 connects the ground portion of the power board 70 and the ground portion of the control board 40 to each other. Therefore, the control ground terminal 566 is a branch terminal, wherein a part of the inverter ground terminal 128 is branched out to the control board 40.

According to the second embodiment, the same effects to the above effects (1) to (4) and (6) to (18) of the first embodiment can be obtained.

Since the control ground terminal 566 is integrally formed with the inverter ground terminal 128, a number of the power terminals 65 on the side to the power board 70 can be reduced, so that a size of a power module 500 can be made smaller.

(Third Embodiment)

Figure 22:
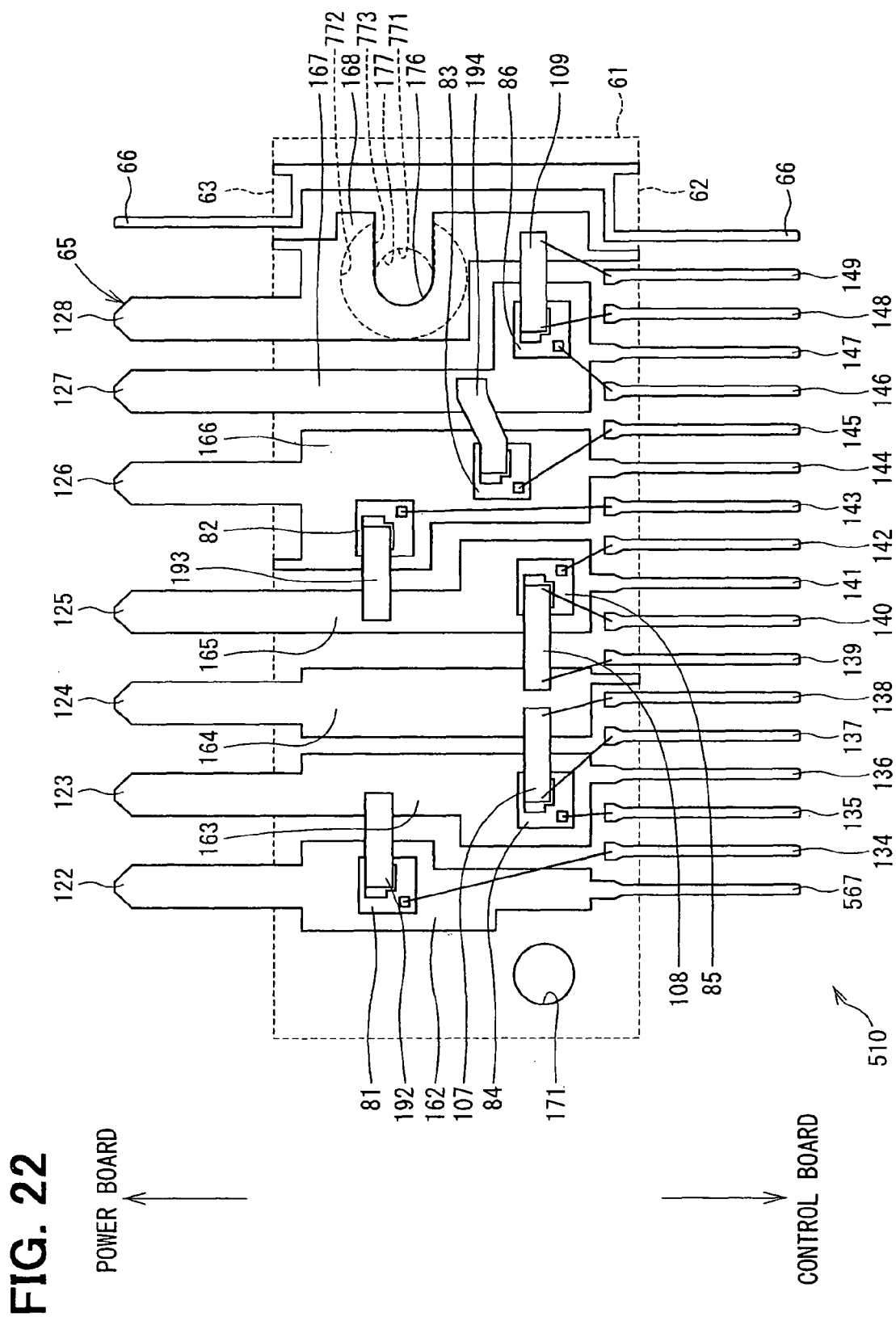
FIG. 22 is a schematic view showing an inside structure of a semiconductor module device of a third embodiment of the present invention.

According to the third embodiment, as shown in FIG. 22, the power-source relays 87 and 88 are not provided in a power module 510.

The inverter input terminal 122 is connected to the power source 75 via the power board 70 and the power connector 79. The inverter input terminal 122 is connected to the capacitors 78 via the power board 70, as in the same manner to the first embodiment.

A control power input terminal 567 is integrally formed with the inverter input terminal 122 and the land 162, so that the control power input terminal 567 can supply the electric power from the power board 70 to the control board 40. Namely, the control power input terminal 567 is a branch terminal for branching out a part of the electric power from the inverter input terminal 122 to the control board 40.

According to the third embodiment, the same effects to the above effects (1) to (10) and (12) to (18) of the first embodiment can be obtained.

Since the control power input terminal 567 is integrally formed with the inverter input terminal 122, a number of the power terminals 65 on the side to the power board 70 can be reduced, so that a size of a power module 510 can be made smaller.

In addition, since the power-source relays 87 and 88 are not provided in the power module 510, the size of the power module 510 can be further made smaller.

(Fourth Embodiment)

Figure 23:
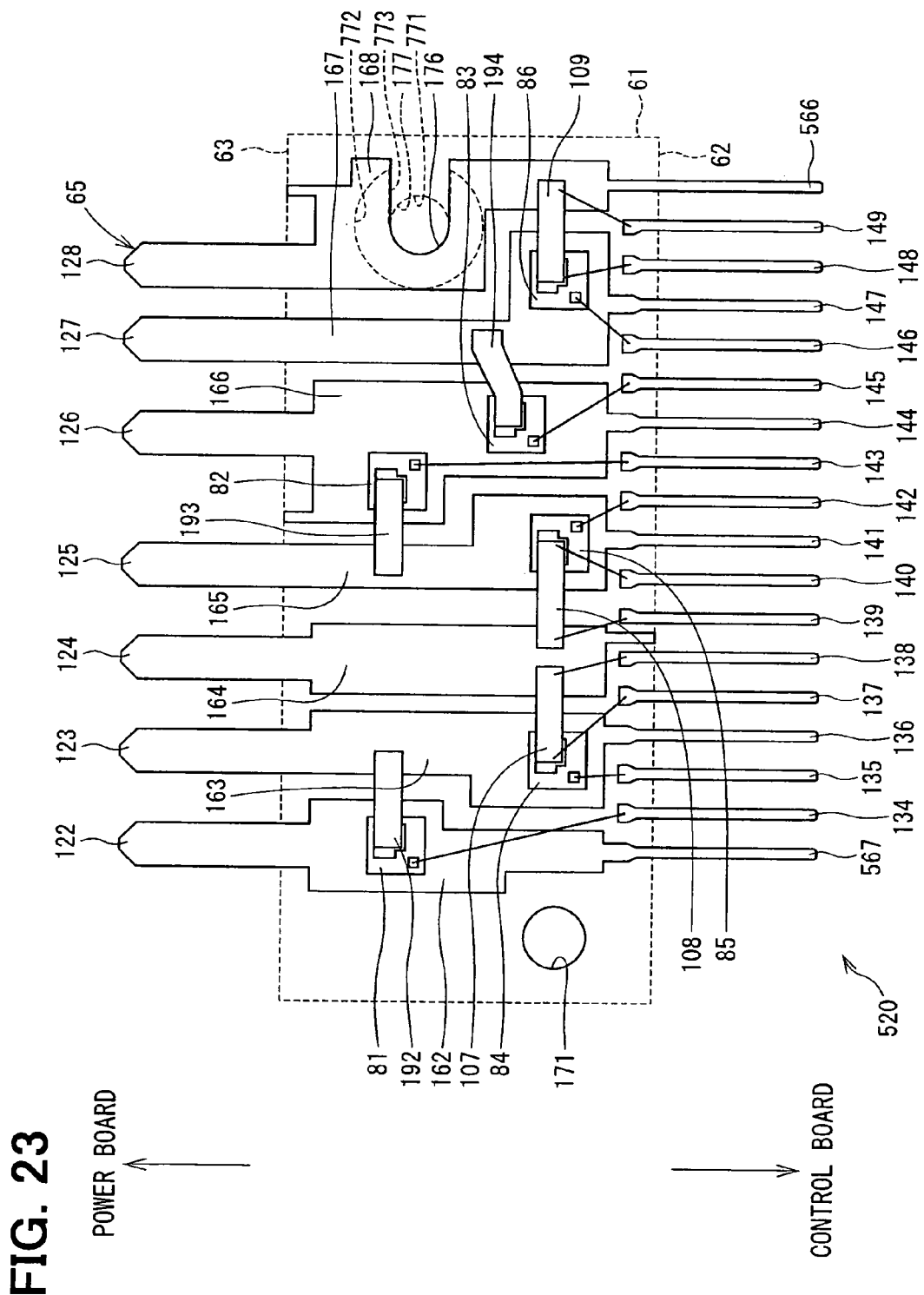
FIG. 23 is a schematic view showing an inside structure of a semiconductor module device of a fourth embodiment of the present invention.

According to the fourth embodiment, as shown in FIG. 23, the control ground terminal 566 is integrally formed with the inverter ground terminal 128 and the land 168, as in the same manner to the second embodiment. The control ground terminal 566 connects the ground portion of the power board 70 and the ground portion of the control board 40 to each other. Therefore, the control ground terminal 566 is the branch terminal, wherein a part of the inverter ground terminal 128 is branched out to the control board 40.

In addition, the power-source relays 87 and 88 are not provided in a power module 520, as in the same manner to the third embodiment. The inverter input terminal 122 is connected to the power source 75 via the power board 70 and the power connector 79. The inverter input terminal 122 is connected to the capacitors 78 via the power board 70. A control power input terminal 567 is integrally formed with the inverter input terminal 122, so that the control power input terminal 567 can supply the electric power from the power board 70 to the control board 40. Namely, the control power input terminal 567 is the branch terminal for branching out a part of the electric power from the inverter input terminal 122 to the control board 40.

According to the fourth embodiment, the same effects to the above effects (1) to (4), (6) to (10) and (12) to (18) of the first embodiment can be obtained.

Since the control ground terminal 566 is integrally formed with the inverter ground terminal 128, a number of the power terminals 65 on the side to the power board 70 can be reduced, so that a size of the power module 520 can be made smaller.

Furthermore, since the control power input terminal 567 is integrally formed with the inverter input terminal 122, a number of the power terminals 65 on the side to the power board 70 can be reduced, so that a size of the power module 520 can be made smaller.

In addition, since the power-source relays 87 and 88 are not provided in the power module 520, the size of the power module 520 can be further made smaller.

(Further Embodiments)

According to the above embodiments, the heat receiving surface 59 of the heat sink 60 is almost perpendicular to the end surface 13 of the motor casing 10 and the power module 60 is provided along the heat receiving surface 59. The power module 60 is, therefore, perpendicular to the end surface 13 of the motor casing 10.

According to a modification thereof, the power module maybe provided in an inclined position with respect to the end surface of the motor casing.

In the above embodiments, the heat radiating blocks 51 are connected to each other by the connecting portion 52. The heat radiating blocks may not be necessarily connected to each other, but may be separately provided.

In the above embodiments, the controller 3 has two inverter systems 80 and 89. The controller may have three inverter systems. The heat radiating blocks may be preferably provided for the respective inverter systems. However, the number of the heat radiating blocks may not be always equal to that of the inverter systems. For example, the heat generated at the power module of one inverter system may be dispersed to multiple heat radiating blocks. Alternatively, the heat generated at the power modules of the multiple inverter systems may be radiated to one heat radiating block.

In the above embodiments, each of the inverter circuits is composed of three pairs of the high-voltage side switching element (81-83) and the low-voltage side switching element (84-86). However, each inverter circuit may have one or two pairs of the switching elements, or may have more than four pairs of the switching elements.

In the above embodiment, the switching element is composed of the MOS transistor. However, any kinds of the switching elements may be used for the power module.

In the above embodiments, the power module has the shunt resisters (107-109) as the current detecting means. However, the current detecting means may be made of any other devices or elements, for example, such as a hall element. The current detecting means may be provided not in the inside of the power module, but at an outside thereof. Furthermore, the current detecting means may not be always provided.

In the above power module, the inverter ground terminal (124) for the U-phase coil and the inverter ground terminal (124) for the V-phase coil are formed as one common terminal. However, they may be separately formed from each other. In a similar manner, the inverter input terminal (126) for the V-phase coil and the inverter input terminal (126) for the W-phase coil are formed as one common terminal. However, they may be separately formed from each other.

Furthermore, the alignment of the terminals for the U-phase coil and W-phase coil is different from the alignment of the terminals for the V-phase coil. However, in each of the terminal groups for the U-phase, V-phase and W-phase coils, the inverter input terminal, the coil terminal and the inverter ground terminal are arranged in this order.

In the above embodiments, the controller 3 is provided at the axial end of the electric motor 2, which is opposite to the other axial end for the output portion of the rotating shaft 35, wherein the output portion is engaged with the gear of the power steering system. The controller may be provided between the electric motor and the gear of the power steering system. In such a case, the rotating shaft passes through the control board and the power board and passes through a space between the pair of the heat radiating blocks.

In the above embodiments, the control board 40 is made of the glass epoxy board and the power board 70 is made of the glass epoxy board having thicker copper foil. The control board as well as the power board may be made of any other material.

In the above embodiments, the control wiring portion is formed on the control board, while the power wiring portion is formed on the power board. The wiring portions may be formed by bus bars, without using the board.

The stator coil terminals 27 may be directly connected to the coil terminals 123, 125 and 127, without going through the power board 70. In such a case, impedance may be decreased.

In the above embodiments, the electric power is supplied to the control board 40 through the power board 70. The electric power maybe directly supplied to the control board from the power source, for example, a power source for an ignition device.

In the above embodiments, the motor casing 10, the control wiring portion (the control board 40), the heat sink 50, the power module 60, and the power wiring portion (the power board 70) are axially arranged in this order. However, they may be arranged in the following order: the motor casing 10, the power wiring portion (the power board 70), the heat sink 50, the power module 60, and the control wiring portion (the control board 40).

The driving apparatus is explained as having been applied to the power steering system. However, the driving apparatus may be applied to the other systems.

The semiconductor module is applied to the controller for controlling the operation of the electric motor. However, the semiconductor module may be applied to a controller for controlling an operation of a power generator. Further, the semiconductor module may be applied to other switching devices.

As above, the present invention should not be limited to the above embodiments, but may be modified in various ways without departing from the spirit of the invention.

What is claimed is:

1. A semiconductor module device, which is provided between a power wiring portion for larger electric current to be supplied to phase coils and a control wiring portion for controlling current supply to the phase coils, comprising:

low-voltage side switching elements, which form a part of an inverter circuit and which are provided on a ground side, for switching on and off the current supply to the phase coils;

high-voltage side switching elements, which form a part of the inverter circuit and which are provided on a higher voltage side than the low-voltage side switching element, for switching on and off the current supply to the phase coils;

inverter input terminals provided in a molded portion at a side thereof facing to the power wiring portion for connecting the high-voltage side switching elements to a power source portion;

coil terminals provided in the molded portion at the side thereof facing to the power wiring portion for connecting the high-voltage side switching elements as well as the low-voltage side switching elements to the phase coils;

inverter ground terminals provided in the molded portion at the side thereof facing to the power wiring portion for connecting the low-voltage side switching elements to the ground;

control terminals provided in the molded portion at another side thereof facing to the control wiring portion, through which control signals for switching on and off the high-voltage side switching elements as well as the low-voltage side switching elements are inputted;

a control power input terminal for supplying electric power from the power wiring portion to the control wiring portion;

a control ground terminal for connecting the control wiring portion to a ground portion of the power wiring portion;

wherein the low-voltage side switching elements, the high-voltage side switching elements, the inverter input terminals, the coil terminals, the inverter ground terminals, the control terminals, the control power input terminal and the control ground terminal are integrally molded in the molded portion.

2. The semiconductor module device according to the claim 1, wherein the control power input terminal is integrally formed with the inverter input terminal.

3. The semiconductor module device according to the claim 1, wherein the control ground terminal is integrally formed with the inverter ground terminal.

4. The semiconductor module device according to the claim 1, wherein the inverter input terminal, the coil terminal and the inverter ground terminal are arranged in this order and neighboring to one another, to thereby form a terminal group.

5. The semiconductor module device according to the claim 4, wherein a first, a second and a third terminal groups are respectively formed by the inverter input terminals, the coil terminals and the inverter ground terminals, and each of the terminal groups corresponding to the respective phase coils, in each of the first and third terminal groups, the inverter input terminal, the coil terminal and the inverter ground terminal are arranged in this order from one longitudinal side of the molded portion, and in the second terminal group neighboring to the first and third terminal groups, the inverter ground terminal, the coil terminal and the inverter input terminal are arranged in this order from the longitudinal side of the molded portion.

6. The semiconductor module device according to the claim 5, wherein the first terminal group, the second terminal group and the third terminal group are arranged in this order.

7. The semiconductor module device according to the claim 5, wherein the inverter ground terminal of the first terminal group and the inverter ground terminal of the second terminal group are formed as one common terminal.

8. The semiconductor module device according to the claim 5, wherein the inverter input terminal of the second terminal group and the inverter input terminal of the third terminal group are formed as one common terminal.

9. The semiconductor module device according to the claim 1, further comprising:

a current detecting means for detecting the electric current to be supplied to the phase coils.

10. The semiconductor module device according to the claim 9, wherein a current detecting wiring portion, which connects the current detecting means to the control wiring portion, is provided at a position which is closer to the control wiring portion than a coil-current flowing area of the molded portion through which electric current flows to the phase coils.

11. The semiconductor module device according to the claim 1, further comprising:

a current cut-off means for cutting off the power supply to the inverter circuit.

* * * * *